United States Patent
An

(10) Patent No.: US 8,374,023 B2
(45) Date of Patent: Feb. 12, 2013

(54) SEMICONDUCTOR MEMORY APPARATUS

(75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 210 days.

(21) Appl. No.: 12/982,972

(22) Filed: Dec. 31, 2010

(65) Prior Publication Data
US 2012/0081953 A1 Apr. 5, 2012

(30) Foreign Application Priority Data

Sep. 30, 2010 (KR) .................. 10-2010-0095648

(51) Int. Cl.
G11C 11/00 (2006.01)
(52) U.S. Cl. ............... 365/163; 365/148; 365/189.16
(58) Field of Classification Search .............. 365/148, 365/158, 163, 171, 189.16, 230.06
See application file for complete search history.

(56) References Cited

U.S. PATENT DOCUMENTS

| 7,633,802 B2* | 12/2009 | Mokhlesi | 365/185.18 |
| 7,706,189 B2* | 4/2010 | Dong et al. | 365/185.19 |
| 2005/0088890 A1 | 4/2005 | Matsunaga et al. | |
| 2006/0140007 A1 | 6/2006 | Cernea et al. | |
| 2009/0103356 A1 | 4/2009 | Mokhlesi | |

FOREIGN PATENT DOCUMENTS

| JP | 11-120778 | 4/1999 |
| JP | 2000-040383 | 2/2000 |
| KR | 1020040007339 A | 1/2004 |
| KR | 1020070060684 A | 6/2007 |
| KR | 1020100006666 A | 1/2010 |
| KR | 1020100067841 A | 6/2010 |
| KR | 1020100067842 A | 6/2010 |
| KR | 1020110118925 A | 11/2011 |

* cited by examiner

Primary Examiner — Gene Auduong
(74) Attorney, Agent, or Firm — William Park & Associates Ltd.

(57) ABSTRACT

A semiconductor memory apparatus includes: a first write control code generation unit configured to generate first write control codes which are updated with different cycles in a plurality of respective periods, in response to a programming verification flag signal and a programming enable signal, the first write control code generation unit determining the number of the plurality of periods depending upon a code value of the repetition times setting codes and an update cycle of the first write control codes in an initial period among the plurality of periods depending upon a code value of initial setting codes; and a data write unit configured to output a first programming current pulse with a magnitude corresponding to a code combination of the first write control codes which are updated.

34 Claims, 20 Drawing Sheets

SEMICONDUCTOR MEMORY APPARATUS

CROSS-REFERENCES TO RELATED APPLICATION

The present application claims priority under 35 U.S.C. §119(a) to Korean application number 10-2010-0095648, filed on Sep. 30, 2010, in the Korean Intellectual Property Office, which is incorporated herein by reference in its entirety.

BACKGROUND

1. Technical Field

The present invention relates to a semiconductor memory apparatus, and more particularly, to a technology for generating a programming current pulse.

2. Related Art

A phase change random access memory (PCRAM) is a non-volatile memory apparatus which programs a memory cell through a programming current pulse.

A PCRAM has a characteristic of a non-volatile memory and can achieve a random access. Also, the PCRAM can be highly integrated at a low cost. The PCRAM stores data by using a phase change material. Specifically, the PCRAM stores data by using a phase change of a phase change material according to a temperature condition, that is, a change in a resistance value according to a phase change.

A phase change material can change to an amorphous state or a crystalline state according to a temperature condition. A representative phase change material is a chalcogenide alloy. A representative chalcogenide alloy is $Ge_2Sb_2Te_5$ composed of germanium (Ge), antimony (Sb), and tellurium (Te). Hence, a phase change material is generally called a "GST".

A PCRAM uses Joule heating generated when a current or voltage is applied to the phase change material (GST) to cause a reversible phase change of a phase change material (GST) between a crystalline state and an amorphous state. In circuit terms, the crystalline state is referred to as a set state. In the set state, the phase change material (GST) has electrical properties substantially equal to those of a metal having a small resistance value. In circuit terms, the amorphous state is referred to as a reset state. In the reset state, the phase change material (GST) has a larger resistance value than that in the set state. That is to say, the PCRAM stores data through a change in a resistance value between the crystalline state and the amorphous state, and determines a level of the stored data by sensing a current flowing through the phase change material (GST) or a voltage change depending on a current change. Generally, the set state is defined as a logic level of '0', and the reset state is defined as a logic level of '1'. A state of the phase change material (GST) is continuously maintained even though power is interrupted.

The amorphous state and the crystalline state of the phase change material (GST) may also be changed by a programming current pulse. A set programming current pulse is a programming current which changes the phase change material (GST) of a memory cell to the set state, and a reset programming current pulse is a programming current which changes the phase change material (GST) of the memory cell to the reset state.

The phage change material (GST) is changed to an amorphous state when the GST is heated to a temperature higher than a melting temperature for a predetermined time and then rapidly cooled. A phage change material (GST) is changed to a crystalline state when the GST is heated to a temperature that is higher than a crystallization temperature and lower that the melting temperature for a preselected time.

Because a resistance value can vary depending upon an amorphous volume or a crystalline volume of the phase change material (GST), a memory cell can be configured in a multi-level form. In general, a large current is flowed as the reset programming current pulse for a time shorter than the set programming current pulse, and a small current is flowed as the set programming current pulse for a time longer than the reset programming current pulse.

FIG. 1 is a diagram illustrating a memory cell of a conventional PCRAM.

Referring to FIG. 1, a memory cell includes a cell diode D1 and a phase change element GST.

The basic operations of the PCRAM configured as mentioned above will be described below.

First, an operation for programming data to the phase change element GST is performed as follows: when a word line WL is activated to a low level, i.e., a ground voltage, and a specified voltage begins to be applied through a bit line BL, since a cell diode D1 becomes a forward biased state, the cell diode D1 is turned on. A current path is formed among the bit line BL, the phase change element GST, and the word line WL. Therefore, a current pulse corresponding to data is supplied to the phase change element GST through the bit line BL, which changes the phase change element GST to the crystalline state or the amorphous state. In general, if data to be programmed has a logic level of '1', the phase change element GST is changed to a reset state by supplying a reset programming current pulse. If data to be programmed has a logic level of '0', the phase change element GST is changed to a set state by supplying a set programming current pulse. The reset state as the amorphous state has a larger resistance value than the set state as the crystalline state.

Also, an operation for detecting data programmed to the phase change element GST is performed as follows:

when the word line WL is activated to the low level, i.e., the ground voltage, and the specified voltage begins to be applied through the bit line BL, since the cell diode D1 becomes the forward biased state, the cell diode D1 is turned on from when the voltage difference between the anode and the cathode of the cell diode D1 is higher than the threshold voltage. The current path is formed among the bit line BL, the phase change element GST, and the word line WL. Therefore, when a specified voltage or a specified current is applied to the phase change element GST through the bit line BL, an amount of current flowing through the phase change element GST or the magnitude of a voltage drop in the phase change element GST varies depending upon the resistance value of the phase change element GST. Therefore, by using this fact, data stored in the phase change element GST is discriminated. That is to say, a state of the phase change element GST is discriminated.

FIG. 2 is a configuration diagram of a data write unit of the conventional PCRAM.

Referring to FIG. 2, a data write unit includes a current control section 10, a current driving section 20, and a selection section 30.

The current control section 10 is configured to control a voltage level of a control node N1 in response to a set control signal SETP and a reset control signal RESETP when a write enable signal WDEN is activated. Current driving forces of an NMOS transistor MN1 controlled by the set control signal SETP and an NMOS transistor MN2 controlled by the reset control signal RESETP are designed to be different from each other. The set control signal SETP and the reset control signal RESETP are inputted in a pulse type.

The current driving section 20 is configured to drive a programming current pulse I_PGM with a magnitude corresponding to the voltage level of the node N1, to an output terminal N2. The programming current pulse I_PGM can be classified into a set programming current pulse corresponding to the set control signal SETP and a reset programming current pulse corresponding to the reset control signal RESETP.

The selection section 30 is configured to output the programming current pulse I_PGM driven from the current driving section 20 to bit lines BL0 through BL3 which respectively correspond to a plurality of select signals YSW<0:3>.

FIG. 3 is a graph showing programming current pulses which are outputted from the data write unit of FIG. 2.

Referring to FIG. 3, it is to be appreciated that a reset programming current pulse may be driven for a short time to a temperature higher than a melting temperature of GST. On the other hand, a set programming current pulse may be driven for a longer time when compared to the reset programming current pulse, and the reset programming pulse may be driven to a temperature below the melting temperature of GST but above the crystallization temperature of GST. For reference, in FIG. 3, the reset programming current pulse is shown as an amorphizing pulse, and the set programming pulse is shown as a crystallizing pulse. In general, the greater the magnitude of the reset programming current pulse, the greater the resistance value of a phase change memory cell increases. Also, the longer the supply time of the set programming current pulse, the longer the phase change memory cell retains its resistance value.

Meanwhile, in a semiconductor memory apparatus, a number of phase change memory cells are provided, and the programming characteristics of the respective phase change memory cells are different due to variables in processes. That is to say, even though a programming current pulse of the same magnitude is applied for the same time, the phase change memory cells are programmed with different resistance values due to different programming characteristics. In other words, consistency and stability in resistance values is lacking when programming a plurality of phase change memory cells with different programming characteristics.

SUMMARY

In one embodiment of the present invention, a semiconductor memory apparatus includes: a first write control code generation unit configured to generate first write control codes which are updated with different cycles in a plurality of respective periods, the first write control code generation unit determining the number of the plurality of periods depending upon a first code value and an update cycle of the first write control codes in an initial period among the plurality of periods; and a data write unit configured to output a first programming current pulse with a magnitude corresponding to a code combination of the first write control codes.

In another embodiment of the present invention, a semiconductor memory apparatus includes: a period control signal generation unit configured to generate a period control signal which is activated after a first preset time; a first write control code generation unit configured to generate first write control codes which are updated with different cycles in a plurality of respective periods, the first write control code generation unit activating update of the first write control codes in response to the period control signal in each period, and determining the number of the plurality of periods depending upon a code value of the repetition times setting codes and an update cycle of the first write control codes a second write control code generation unit configured to generate a second write control code which is activated for a predetermined time; and a data write unit configured to output a first programming current pulse with a magnitude corresponding to a code combination of the first write control codes which are updated or a second programming current pulse with a magnitude corresponding to the second write control code.

In another embodiment of the present invention, a semiconductor memory apparatus includes: a data write unit configured to output a programming current pulse with a magnitude corresponding to a code combination of write control codes which are updated wherein the programming current pulse stably programs a plurality of memory cells comprised of a phase change material.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to an embodiment of the present invention is described below with reference to the accompanying drawings.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described.

Figure 1:
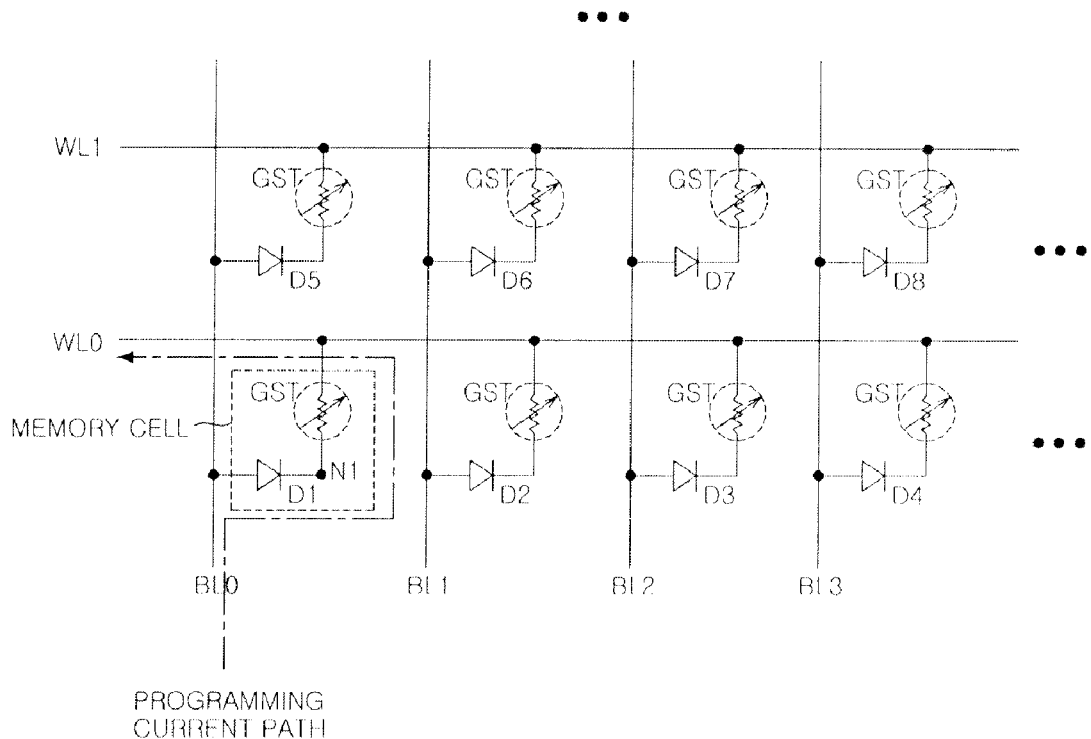
FIG. 1 is a diagram illustrating a memory cell of a conventional PCRAM.
Figure 2:
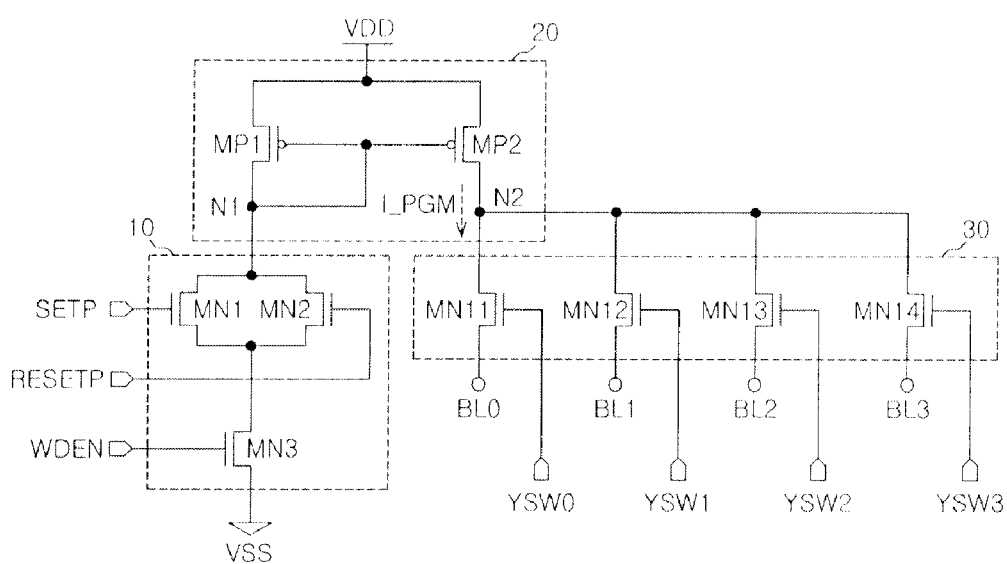
FIG. 2 is a configuration diagram illustrating a data write unit of the conventional PCRAM.
Figure 3:
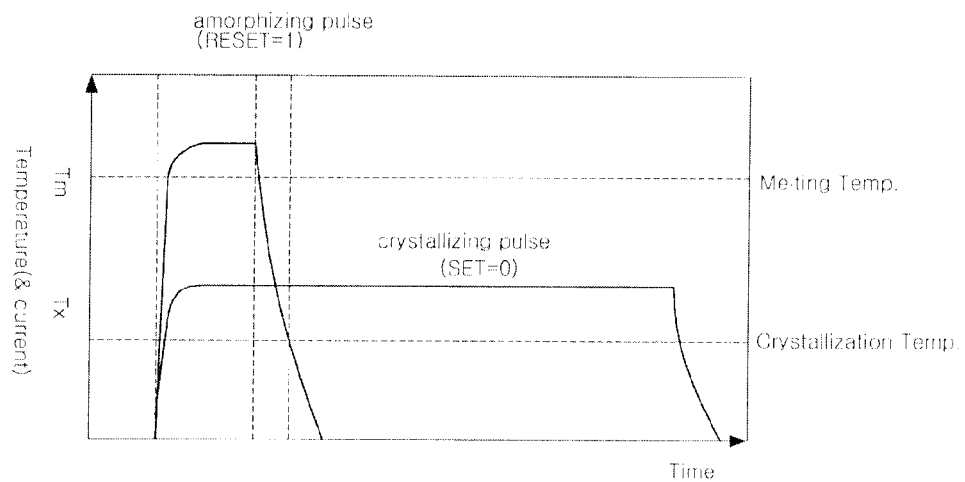
FIG. 3 is a graph showing programming current pulses which may be outputted from the data write unit of FIG. 2.
Figure 4:
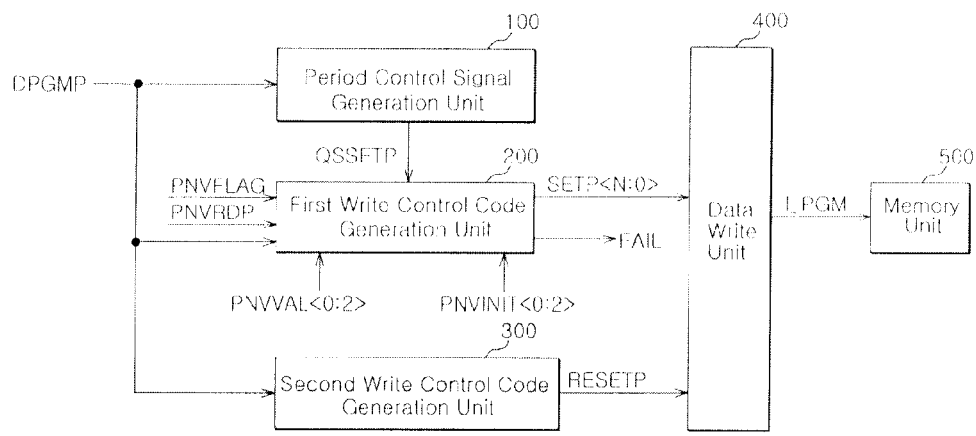
FIG. 4 is a configuration diagram illustrating a semiconductor memory apparatus in accordance with an embodiment of the present invention.

FIG. 4 is a configuration diagram illustrating a semiconductor memory apparatus in accordance with an embodiment of the present invention.

The semiconductor memory apparatus in accordance with the present embodiment of the invention includes only a simplified configuration for the sake of clear description of the technical spirit to be suggested.

Referring to FIG. 4, a semiconductor memory apparatus includes a period control signal generation unit 100, a first write control code generation unit 200, a second write control code generation unit 300, a data write unit 400, and a memory unit 500.

The detailed configuration and the principal operations of the semiconductor memory apparatus configured as mentioned above will be described below.

The period control signal generation unit 100 is configured to generate a period control signal QSSETP which is activated after a first preset time, in response to a programming enable signal DPGMP. That is to say, the period control signal QSSETP is activated after the first preset time from an activation timing of the programming enable signal DPGMP.

The first write control code generation unit 200 is configured to generate first write control codes SETP<N:0> which are updated for each of a plurality of periods with a different cycle. The write control codes SETP<N:0> may be updated in response to a programming verification flag signal PNVFLAG and the programming enable signal DPGMP. The first write control code generation unit 200 activates the update of the first write control codes SETP<N:0> in response to the period control signal QSSETP in each period. The first write control code generation unit 200 determines the number of the plurality of periods depending upon a code value of repetition times setting codes PNVVAL<0:2>. The first write control code generation unit 200 also determines an update cycle of the first write control codes SETP<N:0> of an initial period among the plurality of periods, where the update cycle depends upon a code value of initial setting codes PNVINT<0:2>. In the present embodiment, the first write control codes SETP<N:0> gradually increases for the plurality of periods as respective periods proceed.

The second write control code generation unit 300 is configured to generate a second write control code RESETP which is activated for a predetermined time, where the second write control code RESETP is activated in response to the programming enable signal DPGMP.

The data write unit 400 is configured to output a programming current pulse I_PGM which has a magnitude corresponding to a code combination of the updated first write control codes SETP<N:0> or a magnitude corresponding to the second write control code RESETP. The programming current pulse I_PGM can be classified into a first programming current pulse corresponding to the first write control codes SETP<N:0> or a second programming current pulse corresponding to the second write control code RESETP. The programming current pulse I_PGM outputted from the data write unit 400 is transferred to the memory unit 500, which supplies the pulse I_PGM to a corresponding memory cell selected among a plurality of memory cells. In the present embodiment, the memory cells are assumed to be phase change memory cells.

Figure 5:
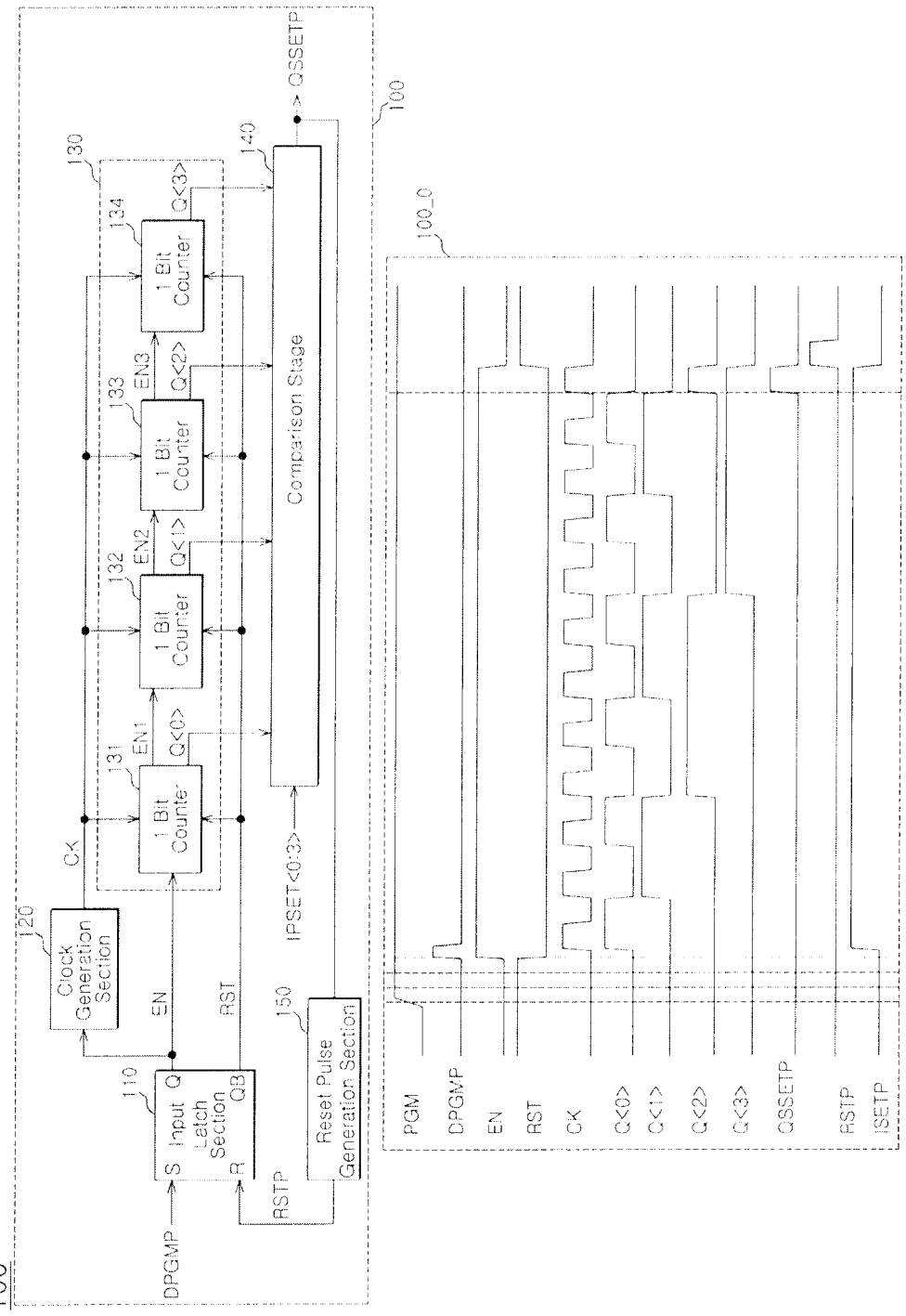
FIG. 5 is a configuration diagram illustrating an exemplary embodiment of the period control signal generation unit shown in FIG. 4 and a timing diagram illustrating internal operations of the period control signal generation unit.

FIG. 5 is a configuration diagram illustrating an exemplary embodiment of the period control signal generation unit shown in FIG. 4 and a timing diagram illustrating internal operations of the period control signal generation unit.

Referring to FIG. 5, the period control signal generation unit 100 includes an input latch section 110, a clock generation section 120, a counter section 130, a comparison section 140, and a reset pulse generation section 150.

The principal operations of the period control signal generation unit 100 configured as mentioned above will be described below with reference to a diagram 100_0.

The input latch section 110 is configured to output a count enable signal EN and a reset signal RST in response to the programming enable signal DPGMP and a reset pulse signal RSTP. In other words, the count enable signal EN is activated to a high level when the programming enable signal DPGMP pulses to a high level, and the reset signal RST is activated to a high level when the reset pulse signal RSTP pulses to a high level.

The clock generation section 120 is configured to generate a clock signal CK in response to the count enable signal EN. Namely, the clock signal CK toggles while the count enable signal EN is activated to the high level.

The counter section 130 is configured to output counting codes Q<0:3> which are counted under the control of the count enable signal EN, the reset signal RST and the clock signal CK. That is to say, the counter section 130 performs a counting operation under the control of the clock signal CK when the count enable signal EN is activated to the high level. If the reset signal RST is activated to the high level, the counting codes Q<0:3> which are outputted from the counter section 130 are initialized. In the case where the counting codes Q<0:3> are generated using the counter section 130 in this way, a size of a circuit can be decreased.

The comparison section 140 is configured to activate and output the period control signal QSSETP when the counting codes Q<0:3> reach a predetermined value. The comparison section 140 is configured to compare the counting codes Q<0:3> and applied setting time control codes IPSET<0:3> with each other and activate the period control signal QSSETP when the counting codes Q<0:3> are the same as the setting time control codes IPSET<0:3>. That is to say, an activation timing of the period control signal QSSETP can be controlled by controlling the setting time control codes IPSET<0:3>.

The reset pulse generation section 150 is configured to delay the period control signal QSSETP for a preselected time and output the reset pulse signal RSTP. The reset pulse generation section 150 may include a delay stage, and a delay value of the delay stage can be set to satisfy a prescribed timing margin.

Hereafter, the detailed configuration of the period control signal generation unit 100 will be described.

Figure 6:
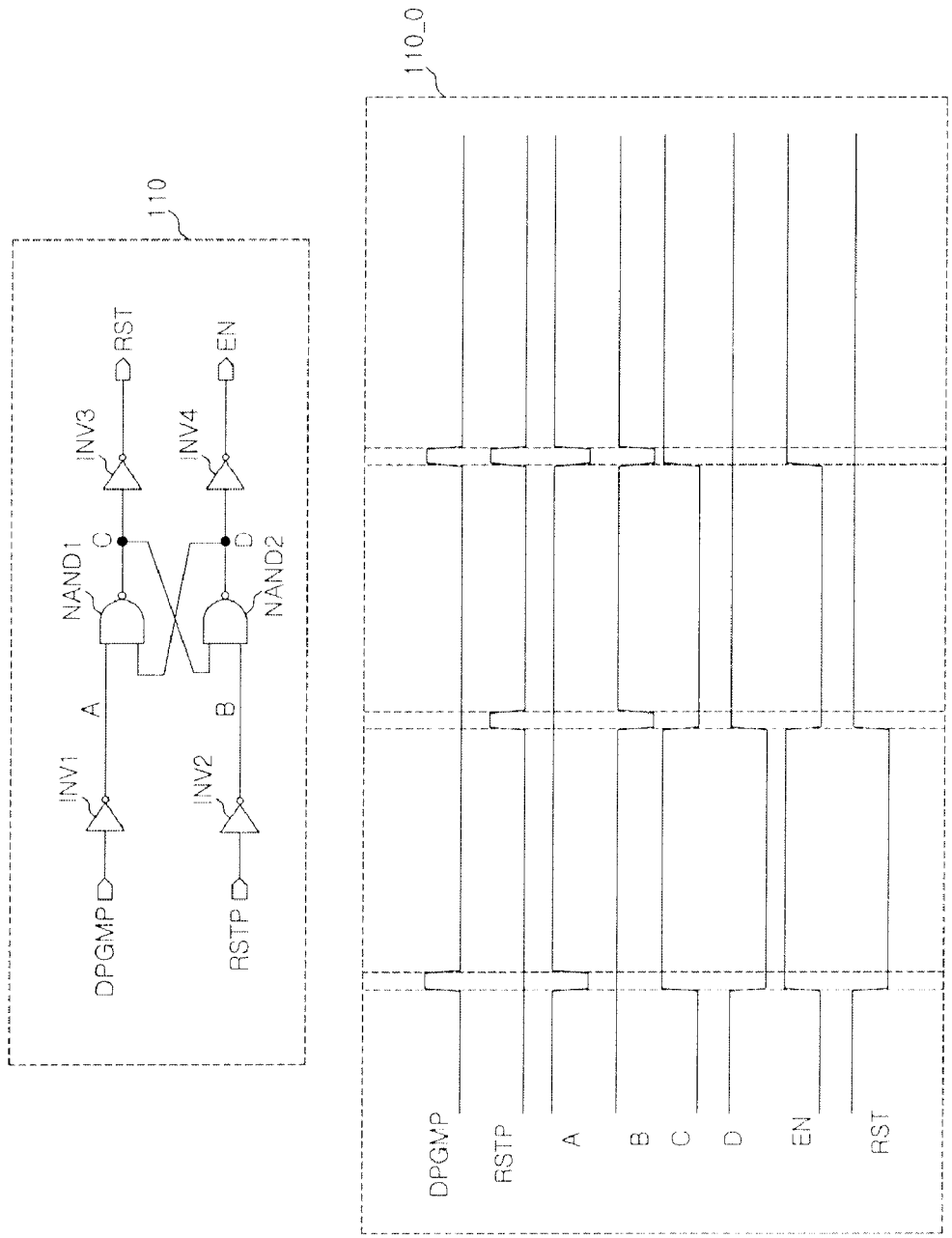
FIG. 6 is a configuration diagram of the input latch section of the period control signal generation unit shown in FIG. 5 and a timing diagram illustrating internal operations of the input latch section.

FIG. 6 is a configuration diagram of the input latch section of the period control signal generation unit shown in FIG. 5 and a timing diagram illustrating internal operations of the input latch section.

Referring to FIG. 6, the input latch section 110 includes an RS latch which is composed of a plurality of NAND gates NAND1 and NAND2. Referring to a timing diagram 110_0, in the input latch section 110, the count enable signal EN is activated to the high level when the programming enable signal DPGMP pulses to the high level, and the reset signal RST is activated to the high level when the reset pulse signal RSTP pulses to the high level.

Figure 7:
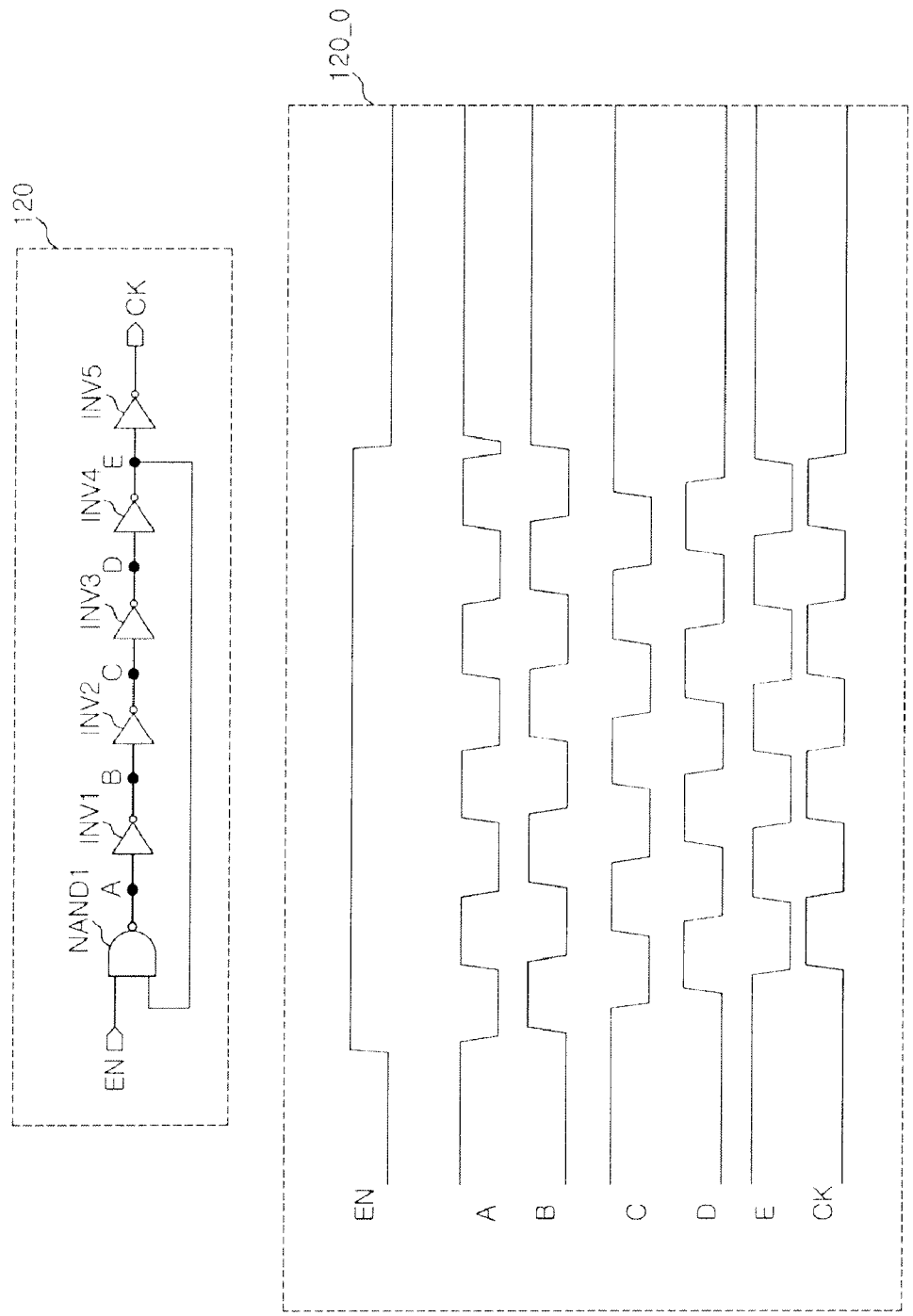
FIG. 7 is a configuration diagram of the clock generation section of the period control signal generation unit shown in FIG. 5 and a timing diagram illustrating internal operations of the clock generation section.

FIG. 7 is a configuration diagram of the clock generation section 120 of the period control signal generation unit 100 shown in FIG. 5. An accompanying timing diagram 120 illustrates internal operations of the clock generation section 120.

Referring to FIG. 7, the clock generation section 120 includes a ring oscillator which is composed of a NAND gate NAND1 and a plurality of inverters INV1 through INV5. Referring to a timing diagram 120_0, the clock generation section 120 outputs the clock signal CK which toggles while the count enable signal EN is activated to the high level.

Figure 8:
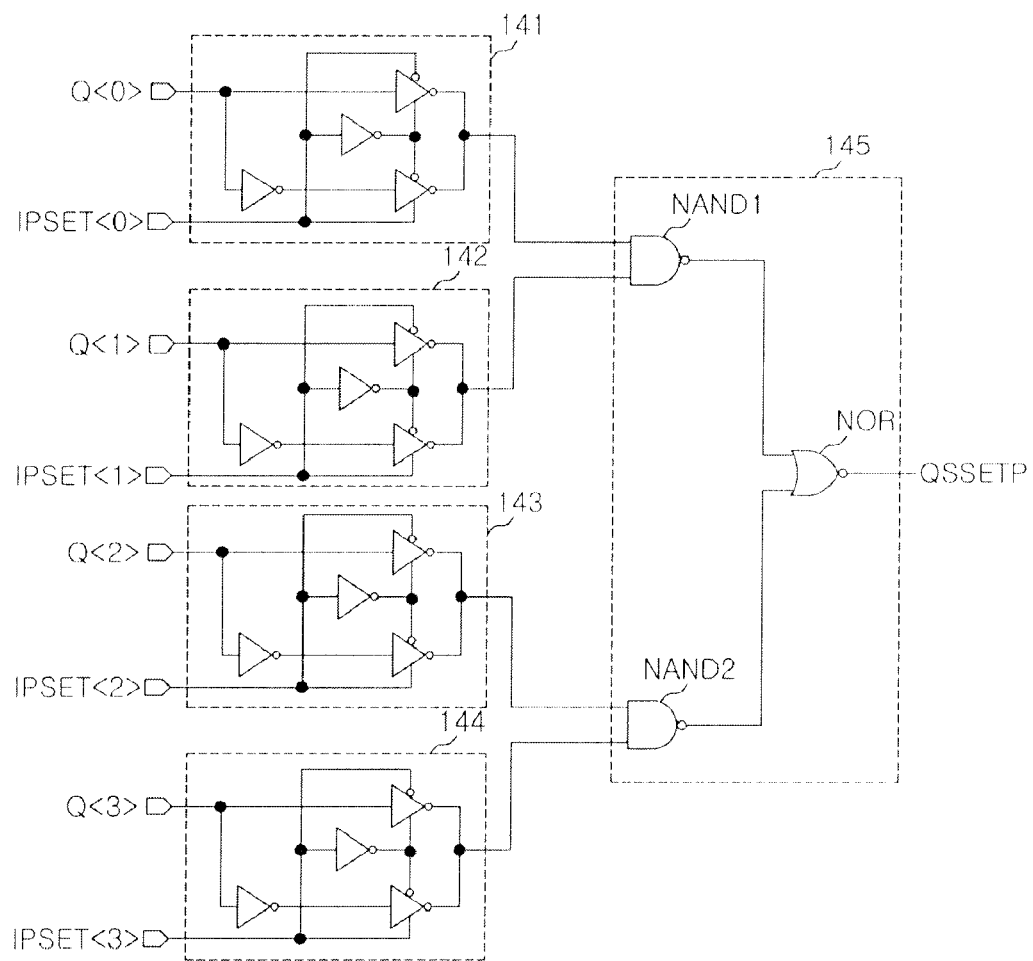
FIG. 8 is a configuration diagram of the comparison section of the period control signal generation unit shown in FIG. 5.

FIG. 8 is a configuration diagram of the comparison section 140 of the period control signal generation unit 100 shown in FIG. 5.

Referring to FIG. 8, the comparison section 140 includes a plurality of comparison stages 141, 142, 143 and 144, and a signal combination stage 145. The plurality of comparison stages 141, 142, 143 and 144 are configured to compare the counting codes Q<0:3> and values of the respective bits of the setting time control codes IPSET<0:3> and output a plurality of comparison result signals. The signal combination stage 145 is configured to combine the plurality of comparison result signals and output the period control signal QSSETP. As can be seen from the embodiment depicted in FIG. 8, the comparison section 140 activates and outputs the period control signal QSSETP when the counting codes Q<0:3> and the setting time control codes IPSET<0:3> are the same with each other.

Figure 9:
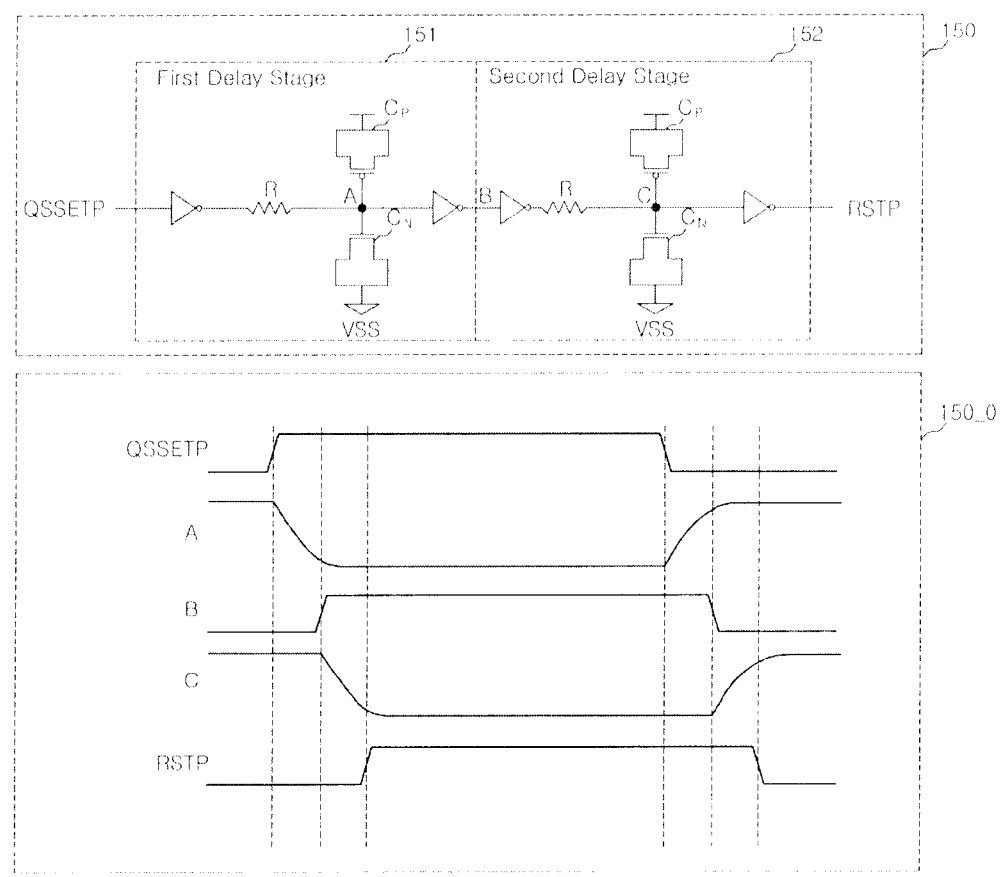
FIG. 9 is a configuration diagram of the reset pulse generation section of the period control signal generation unit shown in FIG. 5 and a timing diagram illustrating internal operations of the reset pulse generation section.

FIG. 9 is a configuration diagram of the reset pulse generation section 150 of the period control signal generation unit shown 100 in FIG. 5. An accompanying timing diagram 150_0 illustrates internal operations of the reset pulse generation section 150.

Referring to FIG. 9, the reset pulse generation section 150 includes a first delay stage 151 which delays the period control signal QSSETP, and a second delay stage 152 which delays a signal outputted from the first delay stage 151 and outputs the reset pulse signal RSTP. Each of the first delay stage 151 and the second delay stage 152 is comprised of a resistor R and MOS capacitors $C_P$ and $C_N$. A time constant may be used in determining a delay value of each stage 151, 152.

Figure 10:
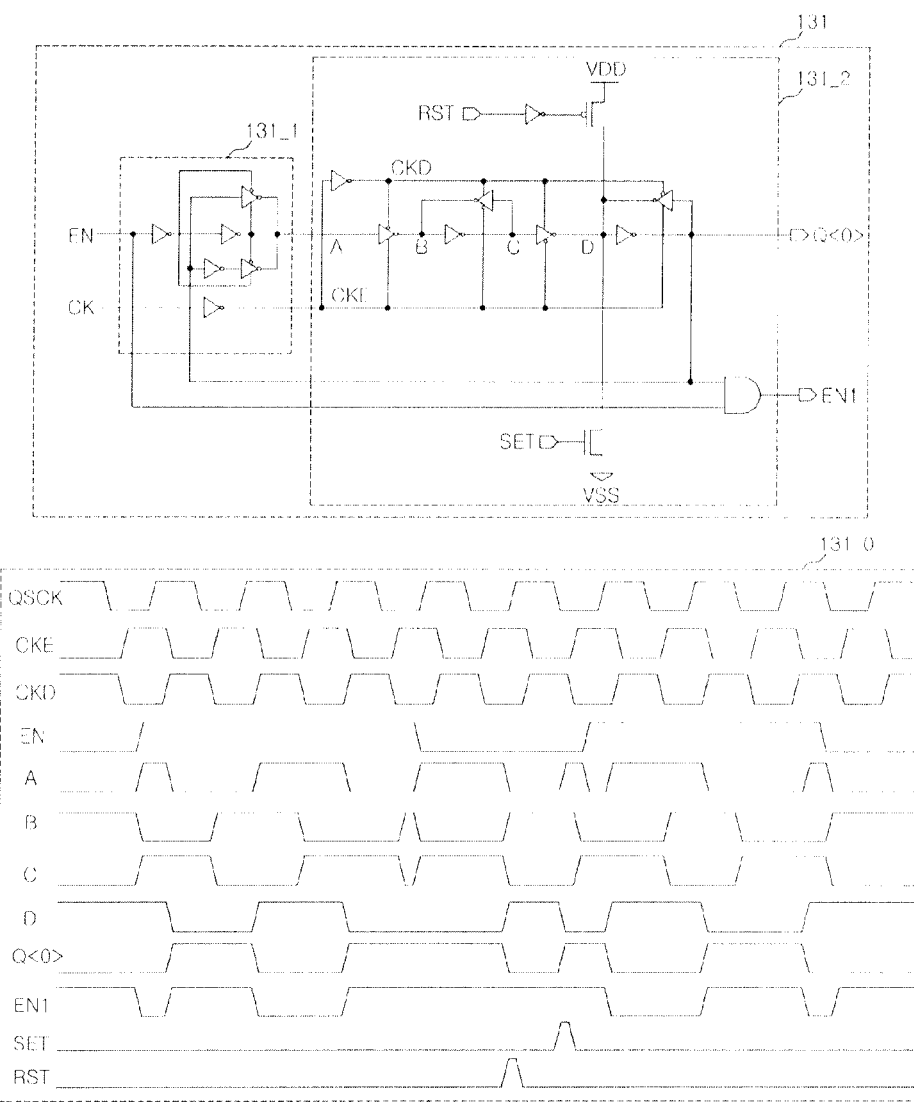
FIG. 10 is a configuration diagram of the counter section of the period control signal generation unit shown in FIG. 5 and a timing diagram illustrating internal operations of the counter section.

FIG. 10 is a configuration diagram of the counter section 130 of the period control signal generation 100 unit shown in FIG. 5. An accompanying timing diagram illustrates internal operations of the counter section 130. FIG. 10 representatively shows a least significant 1 bit counter 131 among a plurality of 1 bit counters 131 through 134 that are depicted in FIG. 5. The counter section 130 is configured to perform an up counting operation.

Referring to FIG. 10, the 1 bit counter 131 includes a signal input part 131_1 and a latch part 131_2.

The signal input part 131_1 determines a signal level of an input node A of the latch part 131_2 in response to the count enable signal EN and the clock signal CK.

The latch part 131_2 latches a signal outputted from the signal input part 131_1 under the control of the clock signal CKE and outputs the first counting code Q<0> and a carry signal EN1. The carry signal EN1 is used as a count enable signal EN1 of the second 1 bit counter 132. An internal node of the latch part 131_2 is initialized or changed to a specified level in response to the reset signal RST and a set signal SET.

Figure 11:
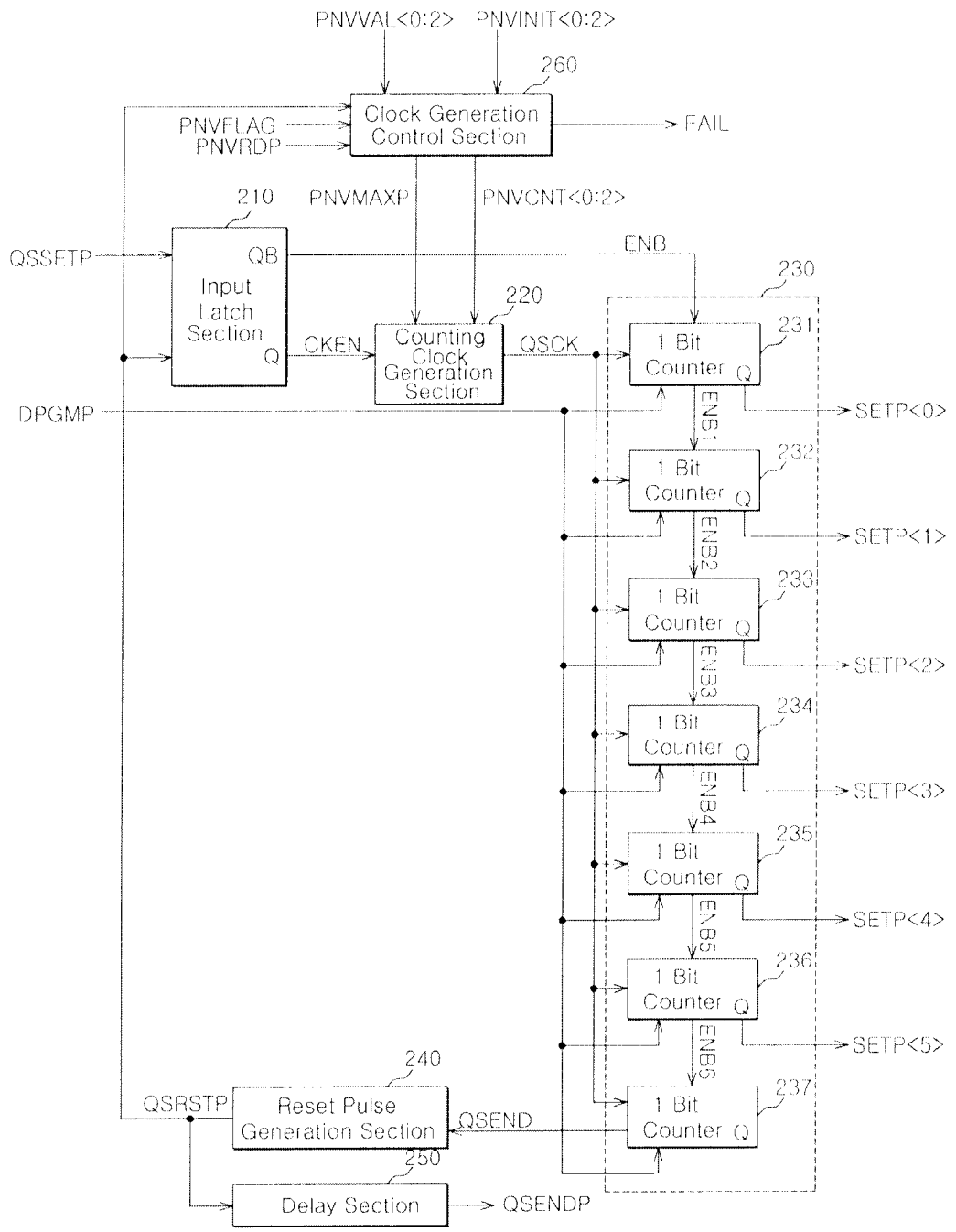
FIG. 11 is a configuration diagram illustrating an exemplary embodiment of the first write control code generation unit shown in FIG. 4.

FIG. 11 is a configuration diagram illustrating an exemplary embodiment of the first write control code generation unit 200 shown ii) in FIG. 4.

Referring to FIG. 11, the first write control code generation unit 200 includes an input latch section 210, a counting clock generation section 220, a write control code counter section 230, a reset pulse generation section 240, a delay section 250, and a clock generation control section 260.

The principal operations and the detailed configuration of the first write control code generation unit 200 configured as mentioned above will be described below in detail.

An input latch section 210 is configured to output a count enable signal ENB and a clock enable signal CKEN in response to the period control signal QSSETP and a reset pulse signal QSRSTP.

The clock generation control section 260 is configured to output cycle setting codes PNVCNT<0:2> which are updated in a code value thereof and a repetition end signal PNVMAXP, in response to the programming verification flag signal PNVFLAG and the reset pulse signal QSRSTP. The clock generation control section 260 determines an initial code value of the cycle setting codes PNVCNT<0:2> depending upon a code value of the initial setting codes PNVINT<0:2>. The control section 260 also determines the number of update times of the cycle setting codes PNVCNT<0:2> depending upon the code value of the repetition times setting codes PNVVAL<0:2>.

Further, the clock generation control section 260 activates the repetition end signal PNVMAXP after the cycle setting codes PNVCNT<0:2> are updated the number of times corresponding to the code value of the repetition times setting codes PNVVAL<0:2>. In the present embodiment, configuration is made in such a manner that the code value of the repetition times setting codes PNVVAL<0:2> increases every time update is implemented. For reference, the programming verification flag signal PNVFLAG is defined as a signal which indicates whether or not data are correctly programmed to memory cells.

The counting clock generation section 220 is configured to generate a counting clock signal QSCK in response to the clock enable signal CKEN and the repetition end signal PNV-MAXP. The counting clock generation section 220 controls a toggling cycle of the counting clock signal QSCK depending upon the code value of the cycle setting codes PNVCNT<0:2>. In the present embodiment, configuration is made in such a manner that the toggling cycle of the counting clock signal QSCK increases as the code value of the cycle setting codes PNVCNT<0:2> increases.

The write control code counter section 230 is configured to generate counting codes which are counted under the control of the programming enable signal DPGMP, the count enable signal ENB and the counting clock signal QSCK. The counter section 230 may also output the first write control codes SETP<N:0>. Accordingly, the update cycle of the first write control codes SETP<N:0> is controlled in correspondence to the toggling cycle of the counting clock signal QSCK.

The reset pulse generation section 240 is configured to activate the reset pulse signal QSRSTP when the counting codes of the write control code counter section 230 reach a predetermined value. For reference, in the present embodiment, a delay section 250 is depicted. The delay section 250 may be configured to delay the reset pulse signal QSRSTP by a predetermined delay value and output a delayed reset pulse signal QSENDP.

Hereafter, the detailed configuration of the first write control code generation unit 200 will be described.

Figure 12:
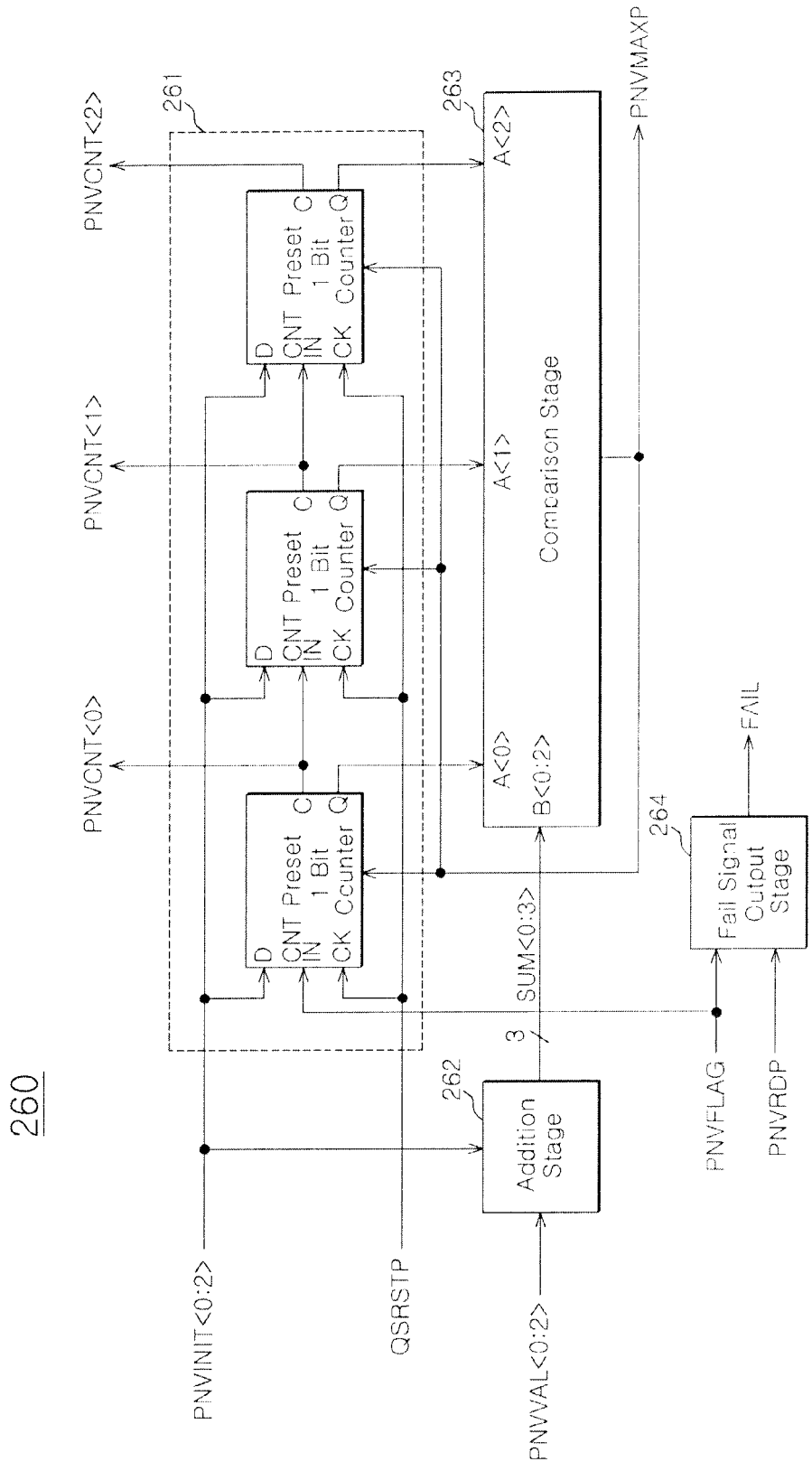
FIG. 12 is a configuration diagram illustrating an exemplary embodiment of the clock generation control section shown in FIG. 11.

FIG. 12 is a configuration diagram illustrating an exemplary embodiment of the clock generation control section 260 shown in FIG. 11.

Referring to FIG. 12, the clock generation control section 260 includes a cycle setting code counter stage 261, an addition stage 262, a comparison stage 263, and a fail signal output stage 264.

The detailed configuration and the principal internal operations of the clock generation control section 260 configured as mentioned above will be described below in detail.

The cycle setting code counter stage 261 is configured to receive the code value of the initial setting codes PNVINT<0:2> as an initial counting code value. The cycle setting code counter stage 261 may also perform a counting operation under control of the programming verification flag signal PNVFLAG and the reset pulse signal QSRSTP.

The addition stage 262 is configured to sum the code values of the repetition times setting codes PNVVAL<0:2> and the initial setting codes PNVINT<0:2>. The addition stage 262 may also output summed codes SUM<0:3>.

The comparison stage 263 is configured to compare the summed codes SUM<0:3> and counting codes outputted from the cycle setting code counter stage 261. The comparison stage 263 may also activate the repetition end signal PNVMAXP depending upon a comparison result. Namely, the comparison stage 263 activates and outputs the repetition end signal PNVMAXP when the summed codes SUM<0:3> and the counting codes are the same with each other.

The fail signal output stage 264 is configured to output a fail signal FAIL, which is selectively activated in response to the programming verification flag signal PNVFLAG and a programming verification signal PNVRDP. The programming verification flag signal PNVFLAG is a signal which indicates whether or not data are correctly programmed. The programming verification flag signal PNVFLAG maintains a high level until the data are correctly programmed to the memory cells, and becomes a low level after the data are precisely programmed to the memory cells. Accordingly, when the programming verification signal PNVRDP which is a signal instructing to verify whether programming is correctly performed to the memory cells is activated, if the programming verification flag signal PNVFLAG maintains the high level, the fail signal FAIL is activated to a high level in consideration of the repetition end signal PNVMAXP. The fail in signal output stage 264 may be configured by a logic stage which combines logics of the programming verification flag signal PNVFLAG and the programming verification signal PNVRDP. Alternatively, the signal output stage 264 may be configured by a flip-flop which receives the programming verification flag signal PNVFLAG and the programming verification signal PNVRDP.

Figure 13:
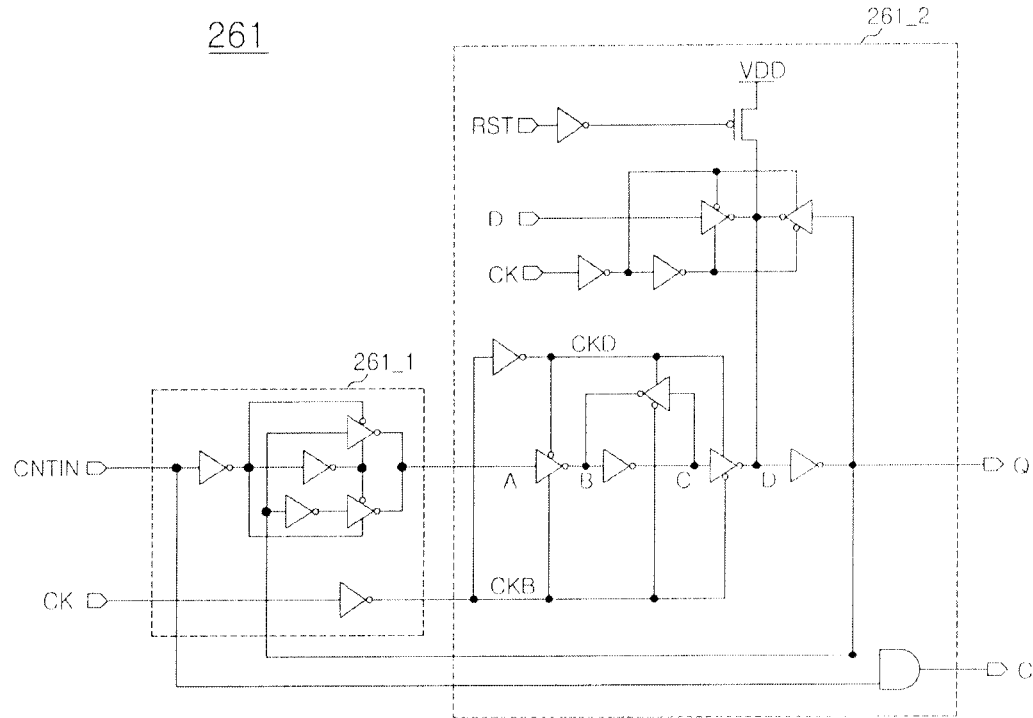
FIG. 13 is a configuration diagram illustrating an exemplary embodiment of the cycle setting code counter stage of the clock generation control section shown in FIG. 12.

FIG. 13 is a configuration diagram illustrating an exemplary embodiment of the cycle setting code counter stage 261 of the clock generation control section 260 shown in FIG. 12. FIG. 13 representatively shows a least significant preset 1 bit counter among a plurality of preset 1 bit counters which constitute the cycle setting code counter stage 261 of FIG. 12. In the present embodiment, each preset 1 bit counter is configured to perform an up counting operation and a latching operation.

Referring to FIGS. 13 and 12 together, the least significant present 1 bit counter includes a signal input part 261_1 and a latch part 261_2.

The signal input part 261_1 is configured to determine a signal level of an input node A of the latch part 261_2 in response to the programming verification flag signal PNV-FLAG inputted as a count input signal CNTIN and the reset pulse signal QSRSTP inputted as an internal clock signal CK.

The latch part 261_2 is configured to latch a signal outputted from the signal input part 261_1 under the control of the internal clock signal CK and output a counting code Q and a carry signal C. The carry signal C is used as the count input signal CNTIN of a second preset 1 bit counter. In the latch part 261_2, an internal node is initialized and changed to a specified level in response to the internal clock signal CK and the reset signal RST. Also, the latch part 261_2, under control of the internal clock signal CD and the reset signal RST, stores a value of the least significant bit PNVINT<0> of the initial setting codes PNVINT<0:2> inputted as an input signal D.

Figure 14:
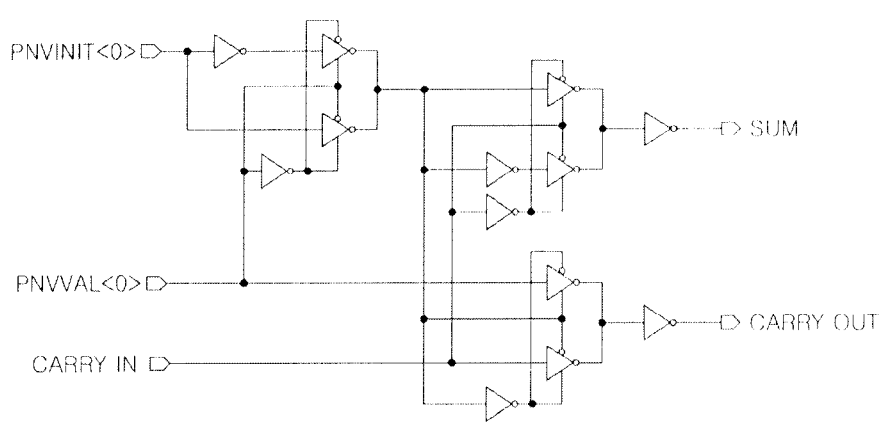
FIG. 14 is a configuration diagram illustrating an exemplary embodiment of the adding stage of the clock generation control section shown in FIG. 12.

FIG. 14 is a configuration diagram illustrating an exemplary embodiment of the adding stage 262 of the clock generation control section 260 shown in FIG. 12. FIG. 14 representatively shows a least significant 1 bit full adder among a plurality of 1 bit full adders which constitute the addition stage 262.

Referring to FIG. 14, the least significant 1 bit full adder, which constitutes the addition stage 262, is configured to perform an operation of summing the least significant bit PNVINT<0> of the initial setting codes PNVINT<0:2> and the least significant bit PNVVAL<0> of the repetition times setting codes PNVVAL<0:2> and, as a result, the least significant 1 bit full adder may output a sum signal SUM and a carry signal CARRY OUT.

Figure 15:
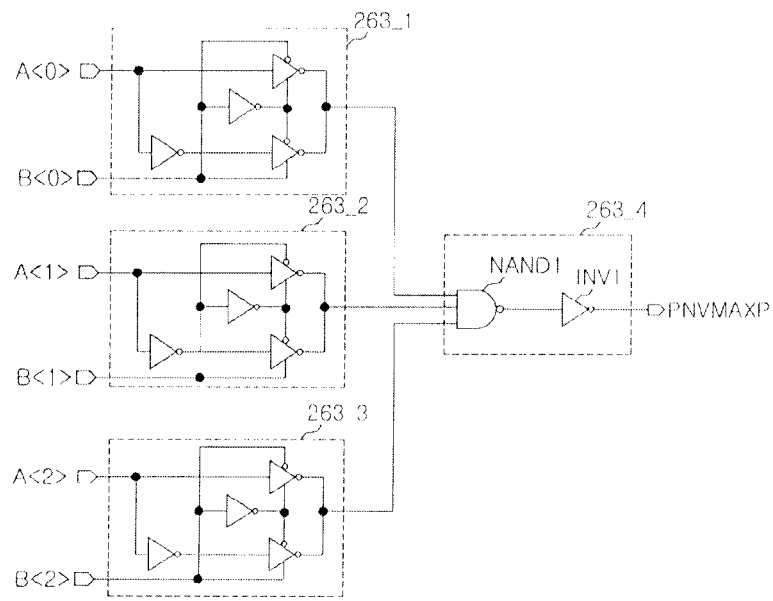
FIG. 15 is a configuration diagram illustrating an exemplary embodiment of the comparison stage of the clock generation control section shown in FIG. 12.

FIG. 15 is a configuration diagram illustrating an exemplary embodiment of the comparison stage 263 of the clock generation control section 260 shown in FIG. 12.

Referring to FIGS. 15 and 12 together, the comparison stage 263 comprises a plurality of comparators 263_1, 263_2 and 263_3 which compare respective bit signals of the counting codes outputted from the cycle setting code counter stage 261 and respective bit signals of the summed codes SUM<0:3>. The comparison stage 263 further comprises a signal combiner 263_4 which combines comparison result signals outputted from the plurality of comparators 263_1, 263_2 and 263_3 and outputs the repetition end signal PNVMAXP.

Hereafter, the detailed configuration of the counting clock generation section 220 will be described.

Figure 16:
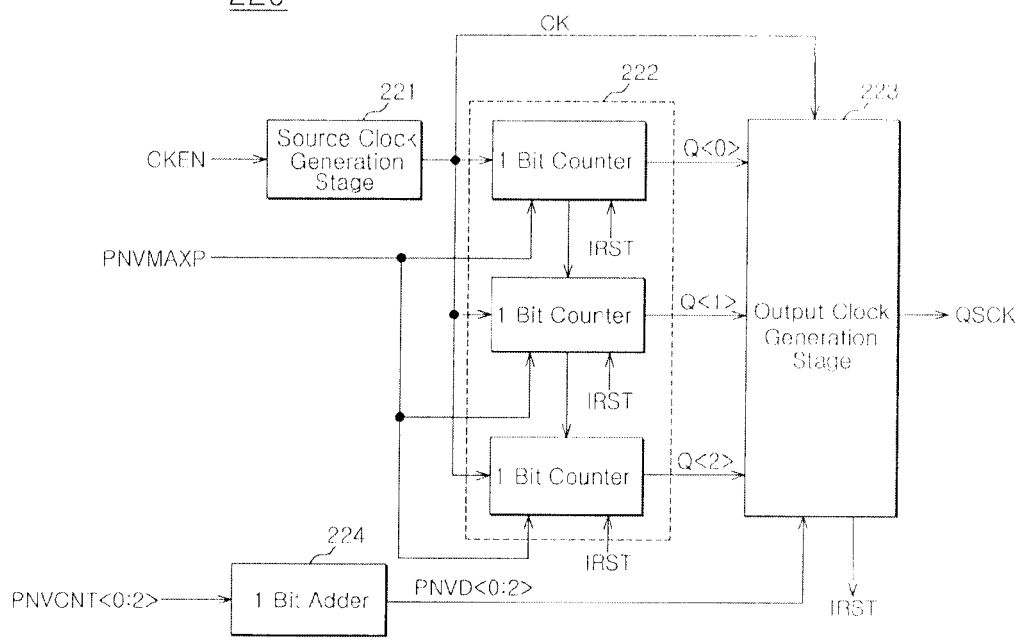
FIG. 16 is a configuration diagram illustrating an exemplary embodiment of the counting clock generation section shown in FIG. 11.

FIG. 16 is a configuration diagram illustrating an exemplary embodiment of the counting clock generation section 220 shown in FIG. 11.

Referring to FIG. 16, the counting clock generation section 220 includes a source clock generation stage 221, an internal counter stage 222, an output clock generation stage 223, and a 1 bit adder 224.

The detailed configuration and the principal internal operations of the counting clock generation section 220 configured as mentioned above will be described below in detail.

The source clock generation stage 221 is configured to output a source clock signal CK which toggles with a predetermined cycle in response to the clock enable signal CKEN. The source clock generation stage 221 may be configured by a ring oscillator, or some other similar apparatus.

The internal counter stage 222 is configured to perform a counting operation under the control of the repetition end signal PNVMAXP, the source clock signal CK and an internal reset signal IRST. The internal counter stage may also output internal counting codes Q<0:2>.

The output clock generation stage 223 is configured to combine the internal counting codes Q<0:2> and the cycle setting codes PNVCNT<0:2> under the control of the source clock signal CK. The clock generation stage 223 may also output the counting clock signal QSCK and the internal reset signal IRST.

Figure 17:
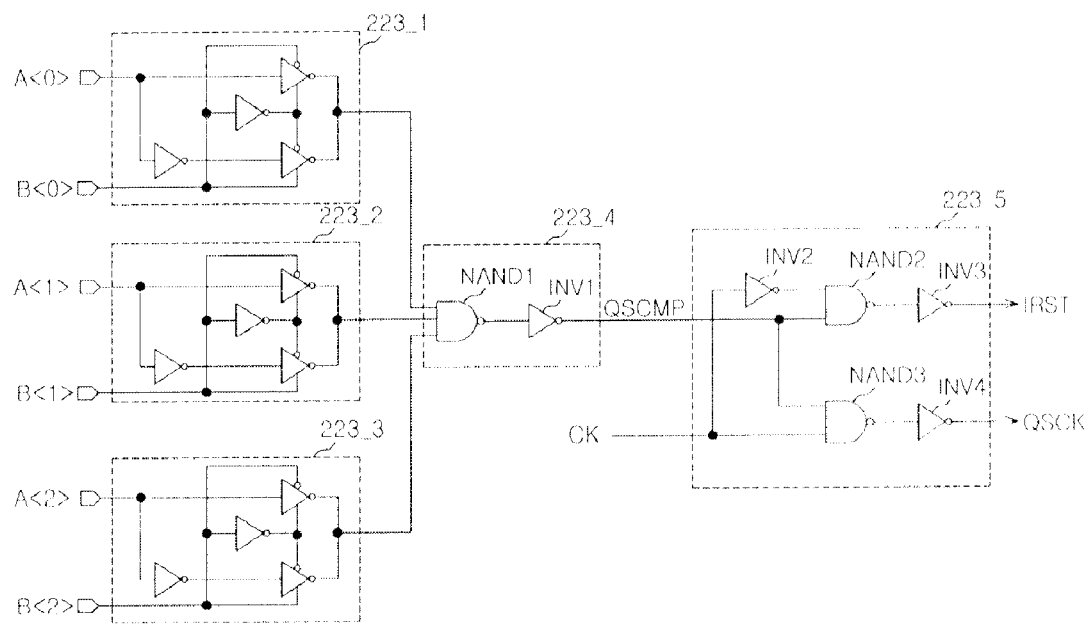
FIG. 17 is a configuration diagram illustrating an exemplary embodiment of the output clock generation stage of the counting clock generation section shown in FIG. 16.

FIG. 17 is a configuration diagram illustrating an exemplary embodiment of the output clock generation stage 223 of the counting clock generation section 220 shown in FIG. 16.

Referring to FIGS. 17 and 16 together, the output clock generation stage 223 includes a plurality of comparison parts 223_1, 223_2 and 223_3, a signal combination part 223_4, and a signal output part 223_5.

The plurality of comparison parts 223_1, 223_2 and 223_3 are configured to compare respective bit values of the internal counting codes Q<0:2> and the cycle setting codes PNVCNT<0:2>, where counting codes Q<0:2> and cycle setting codes PNVCNT<0:2> are represented as A<0:2> and B<0:2>. The plurality of comparison parts 223_1, 223_2 and 223_3 may also output a plurality of comparison result signals. The signal combination part 223_4 is configured to combine the plurality of comparison result signals outputted from the plurality of comparison parts 223_1, 223_2 and 223_3 and output a combination signal QSCMP. The signal output part 223_5 is configured to output the counting clock signal QSCK and the internal reset signal IRST under the control of the internal clock signal CK and the combination signal QSCMP.

For reference, in the present embodiment, the output clock generation part 223 is configured to sum the cycle setting codes PNVCNT<0:2> and a predetermined code value and combine resultant codes with the internal counting codes Q<0:2>. That is to say, the output clock generation part 223 is configured to compare resultant signals PNVD<0:2> acquired by adding '1' to the code value of the cycle setting codes PNVCNT<0:2> through the 1 bit counter 224, with the internal counting codes Q<0:2>. In the present embodiment, the more the code value of the cycle setting codes PNVCNT<0:2> increases, the more the togging cycle of the counting clock signal QSCK is gradually lengthened. For reference, the 1 bit counter 224 is an element which may be selectively provided depending upon a design.

Figure 18:
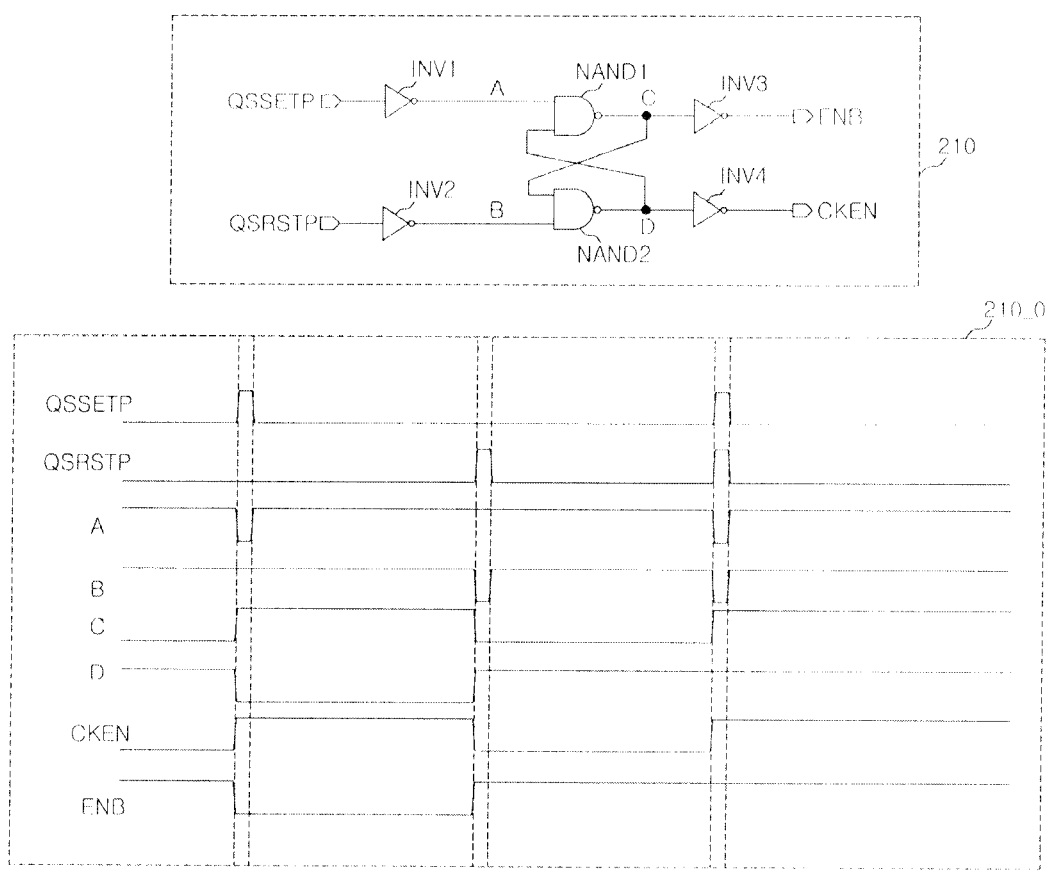
FIG. 18 is a configuration diagram of the input latch section of the first write control code generation unit shown in FIG. 11 and a timing diagram illustrating internal operations of the input latch section.

FIG. 18 is a configuration diagram of the input latch section 210 of the first write control code generation unit 200 shown in FIG. 11 and a timing diagram illustrating internal operations of the input latch section.

Referring to FIG. 18, the input latch section 210 includes an RS latch which is constituted by a plurality of NAND gates NAND1 and NAND2. Referring to a timing diagram 210_0, the input latch section 210 outputs the count enable signal ENB and the clock enable signal CKEN in response to the period control signal QSSETP and the reset pulse signal QSRSTP. In other words, if the period control signal QSSETP pulses to a high level, the count enable signal ENB is activated to a low level, and the clock enable signal CKEN is activated to a high level.

Figure 19:
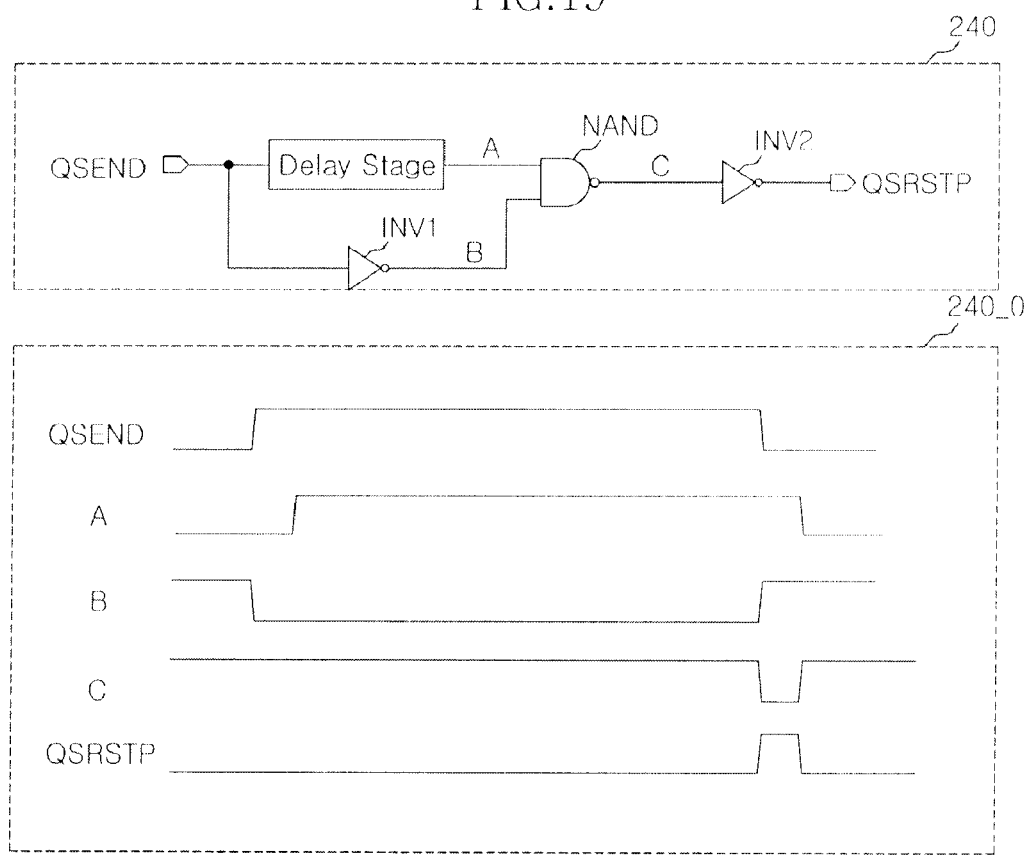
FIG. 19 is a configuration diagram of the reset pulse generation section of the first write control code generation unit shown in FIG. 11 and a timing diagram illustrating internal operations of the reset pulse generation section.

FIG. 19 is a configuration diagram of the reset pulse generation section 240 of the first write control code generation unit 200 shown in FIG. 11 and a timing diagram illustrating internal operations of the reset pulse generation section. The reset pulse generation section 240 is configured to generate the reset pulse signal QSRSTP when the counting codes reach a predetermined value.

Referring to FIGS. 19 and 11 together, when a signal QSEND outputted from a 1 bit counter 237 for detection, which receives a signal ENB6 outputted from a most significant 1 bit counter 236, is activated to a high level, the reset pulse generation section 240 generates the reset pulse signal QSRSTP which pulses to a high level, using the signal QSEND. That is to say, the reset pulse generation section 240 generates the signal which pulses to the high level, by NANDing a signal A, generated by delaying the signal QSEND outputted from the 1 bit counter 237 for detection through a delay stage, and an inverted signal of the signal QSEND.

Figure 20:
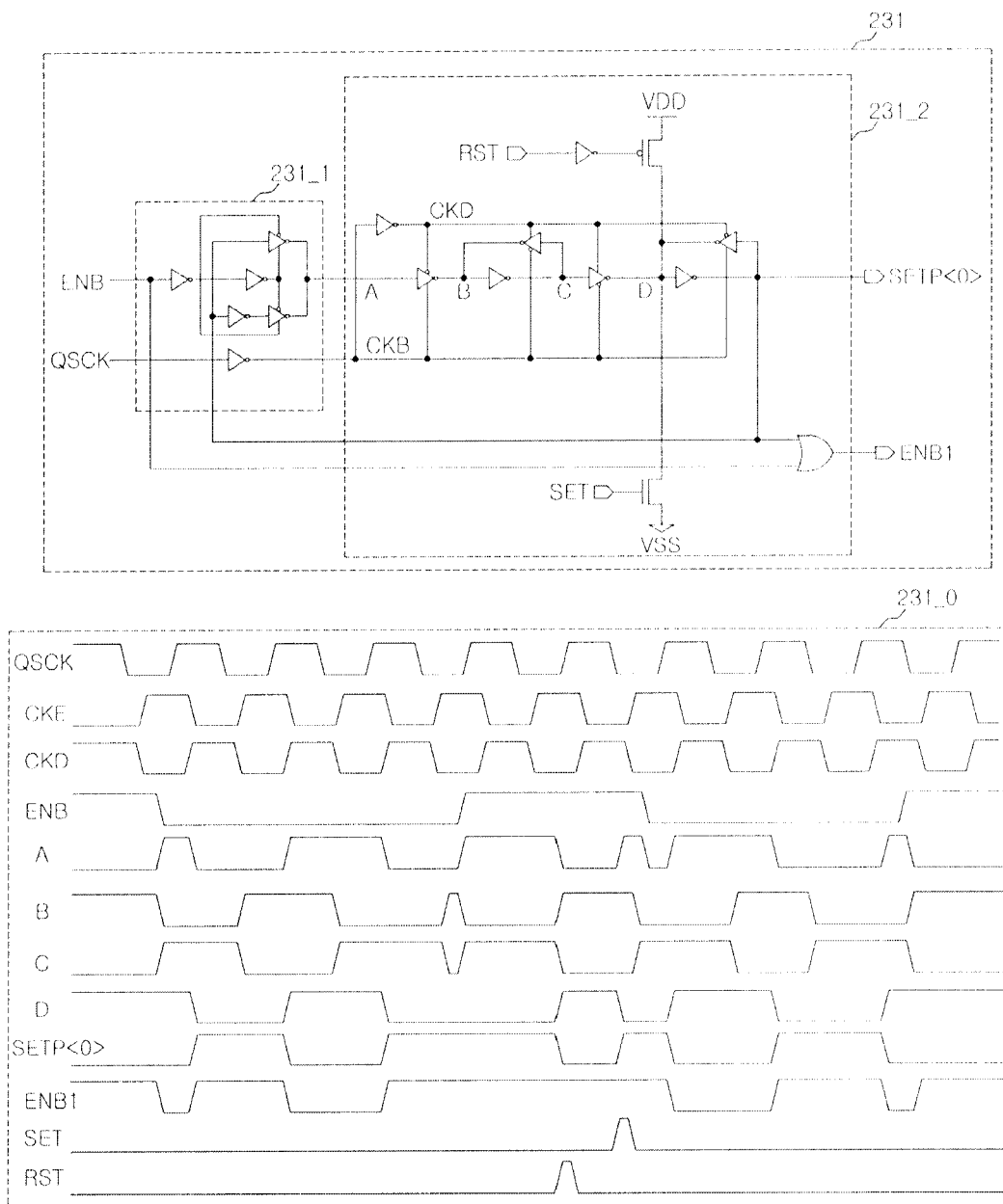
FIG. 20 is a configuration diagram of the write control code counter section of the first write control code generation unit shown in FIG. 11 and a timing diagram illustrating internal operations of the counter section.

FIG. 20 is a configuration diagram of the write control code counter section of the first write control code generation unit shown in FIG. 11 and a timing diagram illustrating internal operations of the counter section.

Referring to FIGS. 20 and 11 together, the write control code counter section 230 generates the counting codes, which are counted under the control of the programming enable signal DPGMP, the count enable signal ENB and the counting clock signal QSCK, and outputs the counting codes as the first write control codes SETP<N:0>. In other words, when the count enable signal ENB is activated to the low level, the write control code counter section 230 performs a counting operation under the control of the counting clock signal QSCK. Accordingly, since a down counting speed is controlled depending upon the toggling cycle of the counting clock signal QSCK, resultantly, the update cycle of the first write control codes SETP<N:0> is also controlled depending upon the toggling cycle of the counting clock signal QSCK.

FIG. 20 representatively shows a least significant 1 bit counter 231 among a plurality of 1 bit counters 231 through 237 which constitute the write control code counter section 230.

Referring to FIG. 20, the 1 bit counter 231 includes a signal input part 231_1 and a latch part 231_2.

The signal input part 231_1 determines a signal level of an input node A of the latch part 231_2 in response to the count enable signal ENB and the first counting code SETP<0>.

The latch part 231_2 latches a signal outputted from the signal input part 231_1 under the control of the counting clock signal QSCK and outputs the first counting code SETP<0> and a borrow signal ENB1. The borrow signal ENB1 is used as a count enable signal ENB of the second 1 bit counter 232. An internal node of the latch part 231_2 is initialized or is changed to a specified level in response to the reset signal RST and a set signal SET.

Figure 21:
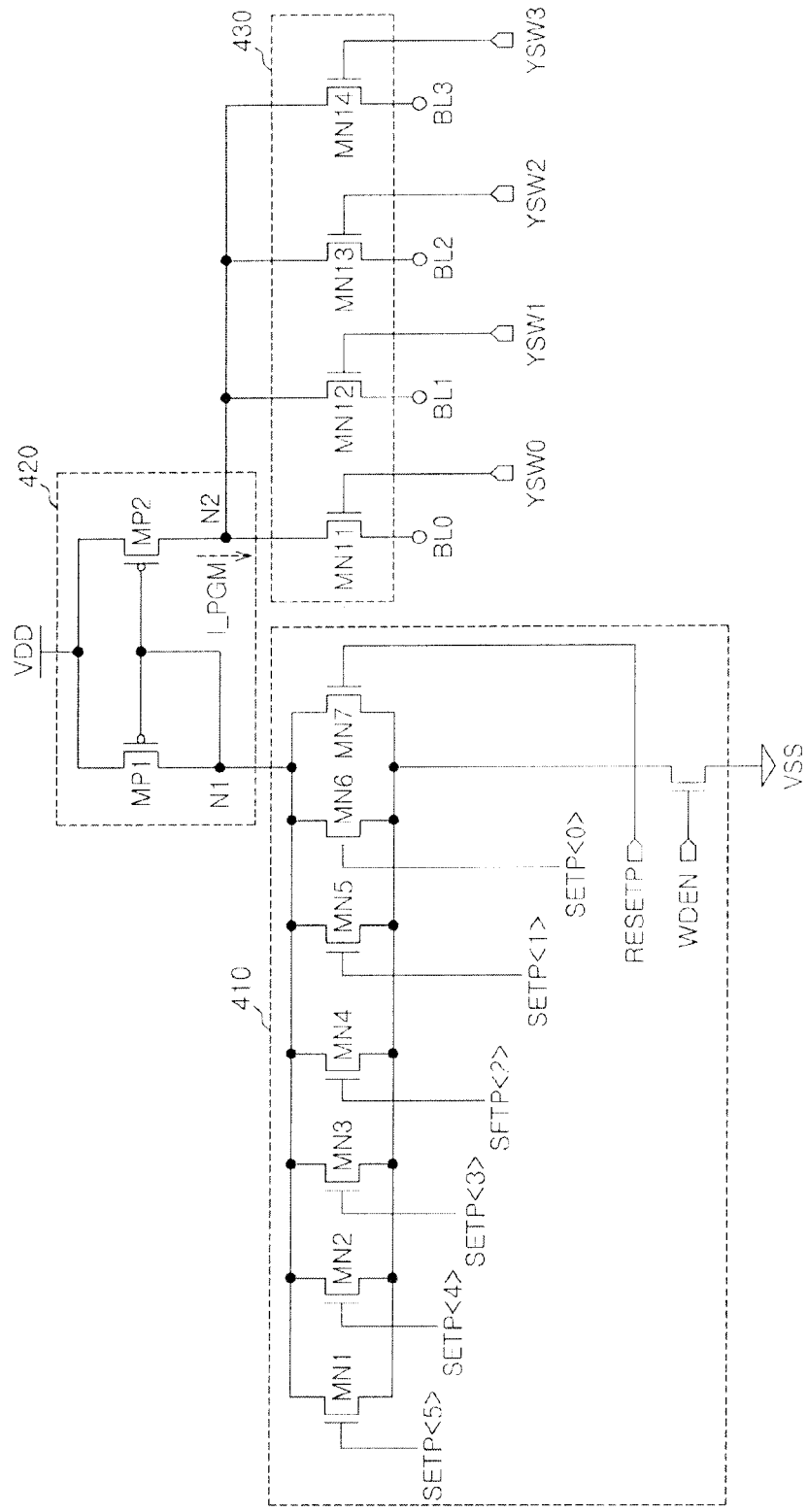
FIG. 21 is a configuration diagram illustrating an exemplary embodiment of the data write unit shown in FIG. 4.

FIG. 21 is a configuration diagram illustrating an exemplary embodiment of the data write unit shown in FIG. 4.

Referring to FIG. 21, the data write unit 400 includes a current control section 410, a current driving section 420 and a selection section 430.

The current control section 410 is configured to control a voltage level of a control node N1 according to a code combination of the first write control codes SETP<N:0> and the second write control code RESETP when a write enable signal WDEN is activated. At this time, a plurality of NMOS transistors MN1 through MN6, which are controlled by the first write control codes SETP<N:0>, are selectively turned on by the code combination of the first write control codes SETP<N:0>, and controls the voltage level of the control node N1. Also, an NMOS transistor MN7, which is controlled by the second write control code RESETP, is turned on when the second write control code RESETP is activated, and controls the voltage level of the control node N1. The first write control codes SETP<N:0> are signals which are cyclically updated, and the second write control code RESETP is a signal which is inputted in a pulse type.

The current driving section 420 is configured to drive a programming current pulse I_PGM with a magnitude corresponding to the voltage level of the control node N1, to an output terminal N2. The programming current pulse I_PGM can be classified into a first programming current pulse corresponding to the first write control codes SETP<N:0> and a second programming current pulse corresponding to the second write control code RESETP.

The selection section 430 is configured to output the programming current pulse I_PGM driven from the current driving section 420 to bit lines BL0 through BL3 which respectively correspond to a plurality of select signals YSW<0:3>.

Figure 22:
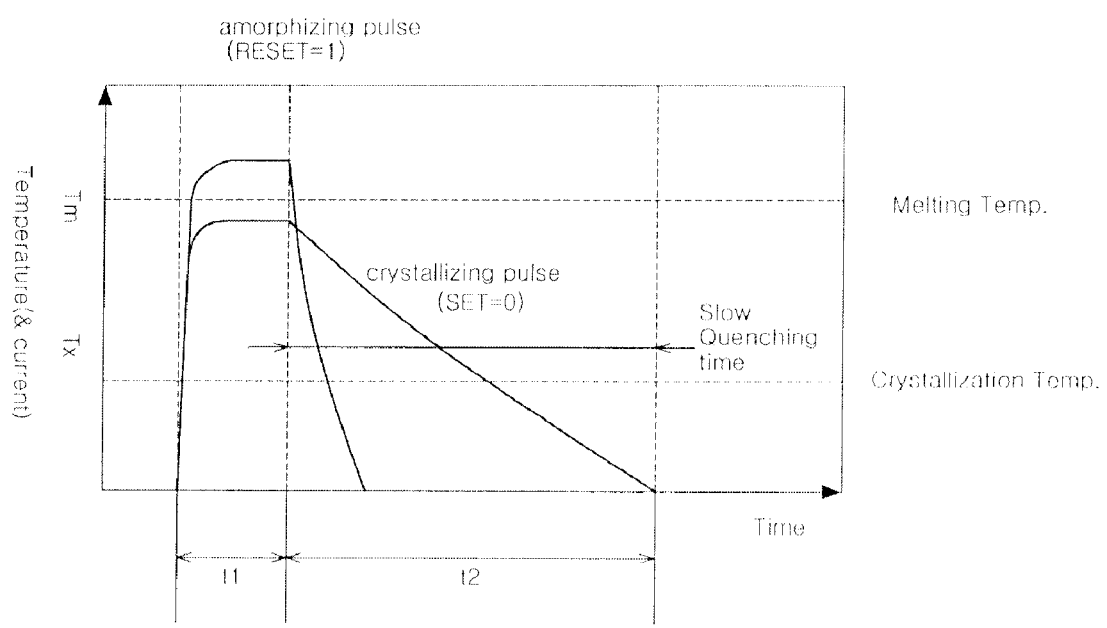
FIG. 22 is a graph showing programming current pulses outputted from the data write unit shown in FIG. 21.

FIG. 22 is a graph showing programming current pulses outputted from the data write unit shown in FIG. 21.

Referring to FIG. 22, the second programming current pulse is driven to be higher than a melting temperature of GST for a short time, and the first programming current pulse is driven to be close, yet below, the melting temperature of GST for an initial first pulse period t1. The temperature in each case thereafter gradually decreases for a second pulse period t2.

The second pulse period t2 of the first programming current pulse is lengthened as the update cycle of the first write control codes SETP<N:0> becomes long. As explained above, the longer a set programming pulse is applied to a phase change memory cell, the longer the cell retains its resistance value. Accordingly, because the second pulse period t2 is lengthened, a crystallization resistance value of the phase change memory cell decreases in correspondence to the time that becomes long. For reference, in the graph, the second programming current pulse is shown as an amorphizing pulse, and the first programming current pulse is shown as a crystallizing pulse.

Figure 23:
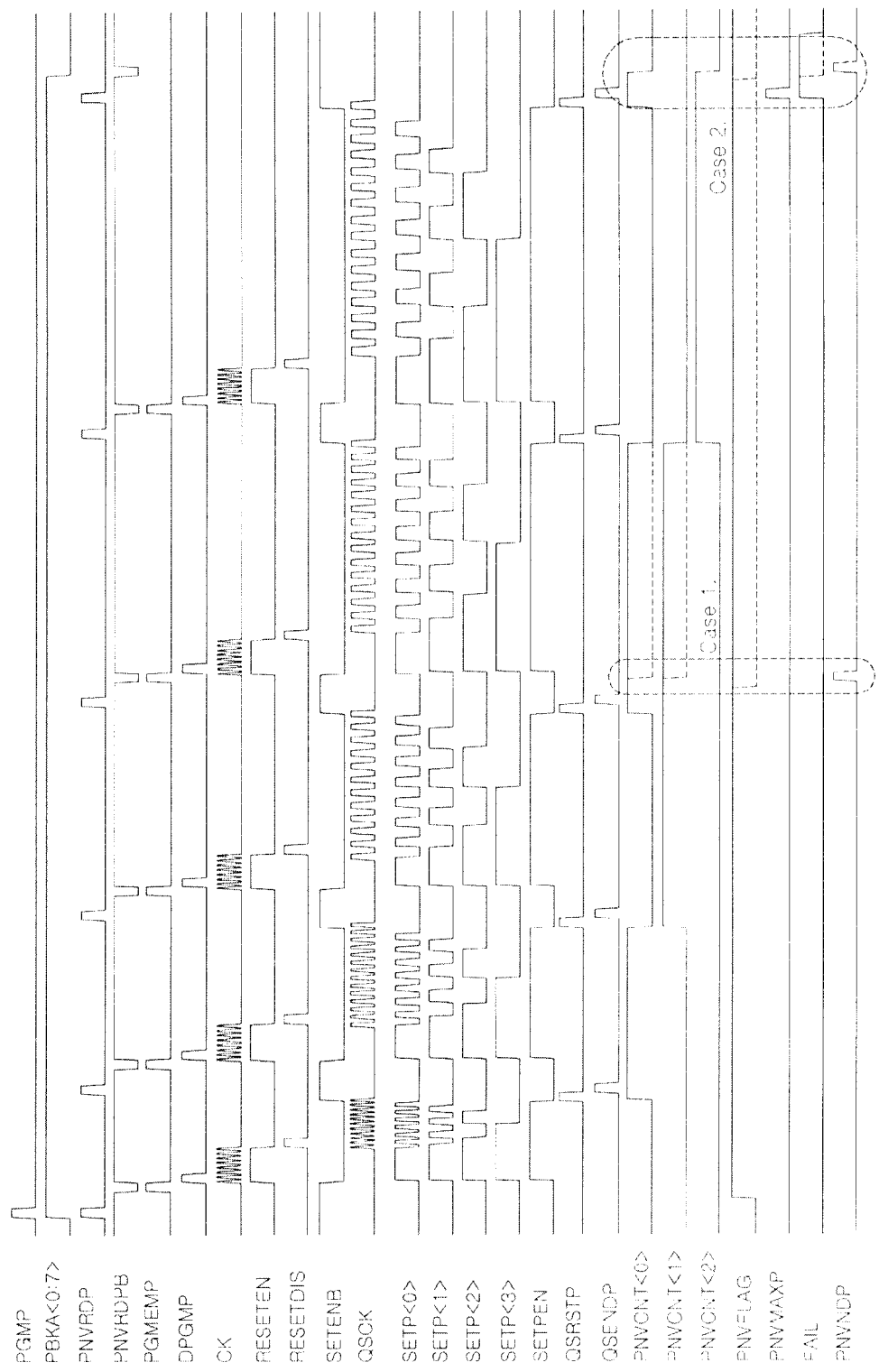
FIG. 23 is a first timing diagram illustrating internal operations of the semiconductor memory apparatus in accordance with the embodiment of the present invention.

FIG. 23 is a first timing diagram illustrating internal operations of the semiconductor memory apparatus in accordance with the embodiment of the present invention.

Principal internal operations of the semiconductor memory apparatus in accordance with an embodiment of the present invention is described below with reference to the first timing diagram of FIG. 23. The first timing diagram shows internal operations when the initial setting codes PNVINT<0:2> are set to "0x0h" and the repetition times setting codes PNVVAL<0:2> are set to "0x5h". That is to say, maximum five programming periods may be progressed. At each time the period is progressed, it is verified whether data are correctly programmed to memory cells, and whether to end a programming operation or to progress a next programming period is determined depending upon a verification result.

In the present embodiment, the first write control codes SETP<N:0> are updated with different cycles for the respective five periods. In other words, the update cycle of the first write control codes SETP<N:0> is controlled in correspondence to the toggling cycle of the counting clock signal QSCK. In the present embodiment, since the toggling cycle of the counting clock signal QSCK is lengthened as the respective periods are progressed, the update cycle of the first write control codes SETP<N:0> gradually lengthens as the respective periods are progressed. As a result, as the respective periods are progressed, a decreasing time of the first programming current pulse with a magnitude corresponding to the code value of the first write control codes SETP<N:0> increases.

In the first timing diagram, the Case 1 represents a case in which, since because data are correctly programmed to the memory cells in a third period, the programming verification flag signal PNVFLAG becomes a low level and a programming period is not progressed any more. The Case 2 represents a case in which, since data are not correctly programmed to the memory cells even after a fifth programming period is progressed, the programming verification flag signal PNVFLAG maintains continuously a high level and the fail signal FAIL is activated to a high level. That is to say, the Case 2 represents a case in which, even though the programming operation is progressed five times through the total five programming periods, data are not finally correctly programmed to the memory cells.

Figure 24:
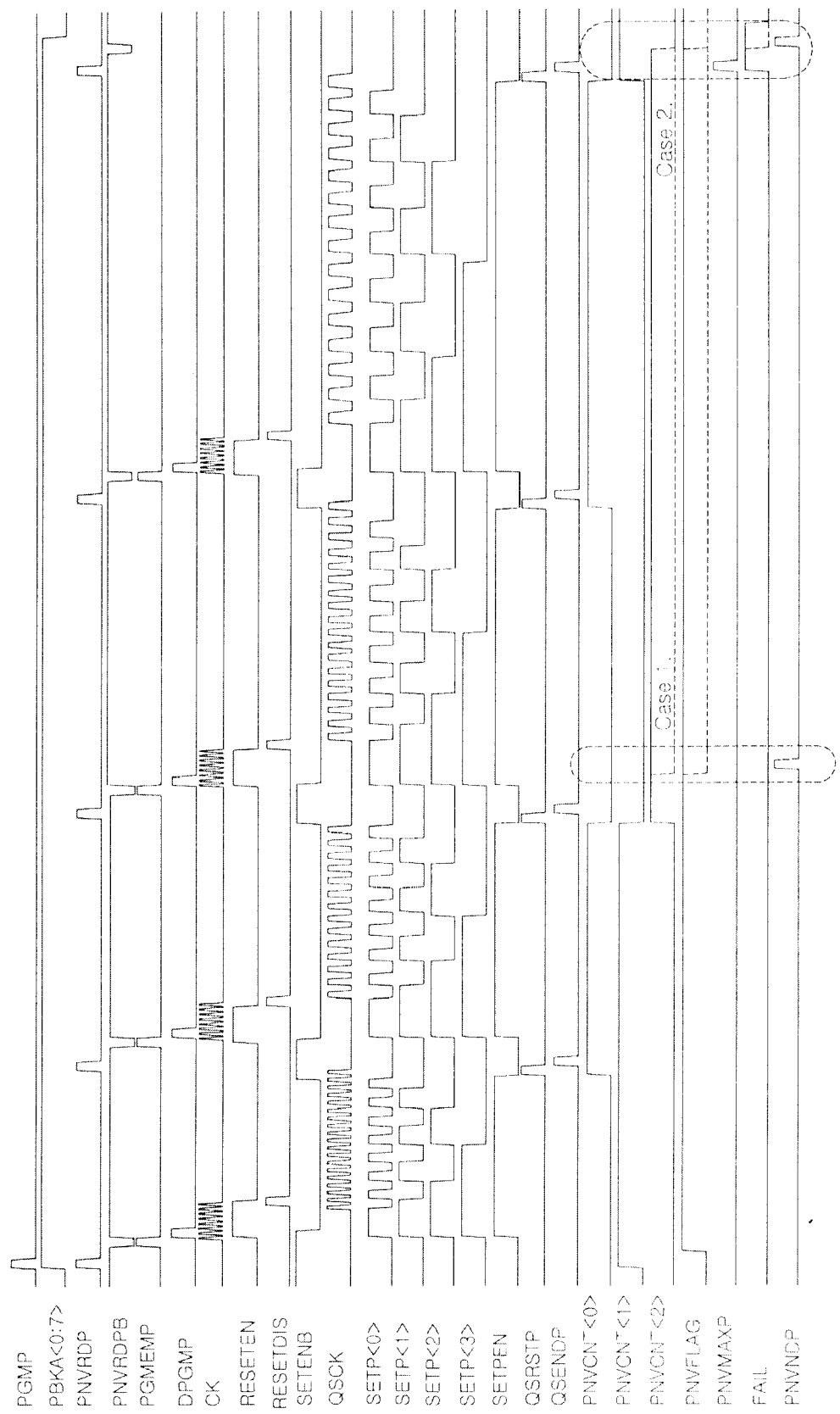
FIG. 24 is a second timing diagram illustrating internal operations of the semiconductor memory apparatus in accordance with the embodiment of the present invention.

FIG. 24 is a second timing diagram illustrating internal operations of the semiconductor memory apparatus in accordance with an embodiment of the present invention.

Principal internal operations of the semiconductor memory apparatus in accordance with an embodiment of the present invention will be described below with reference to the second timing diagram of FIG. 24. The second timing diagram shows internal operations when the initial setting codes PNVINT<0:2> are set to "0x2h" and the repetition times setting codes PNVVAL<0:2> are set to "0x4h". That is to say, maximum four programming periods may be progressed. At each time the period is progressed, it is verified whether data are correctly programmed to memory cells, and whether to end a programming operation or to progress a next programming period is determined depending upon a verification result.

In the present embodiment, the first write control codes SETP<N:0> are updated with different cycles for the respective four periods. In other words, the update cycle of the first write control codes SETP<N:0> is controlled in correspondence to the toggling cycle of the counting clock signal QSCK. Since the initial setting codes PNVINT<0:2> are set to "0x2h", when compared to the first timing diagram shown in FIG. 23, it can be observed that the update cycle of the first write control codes SETP<N:0> in an initial period is relatively lengthened. In the present embodiment, since the toggling cycle of the counting clock signal QSCK is lengthened as the respective periods are progressed, the update cycle of the first write control codes SETP<N:0> is gradually lengthened too as the respective periods are progressed. As a result, as the respective periods are progressed, a decreasing time of the first programming current pulse with a magnitude corresponding to the code value of the first write control codes SETP<N:0> increases.

In the second timing diagram, the Case 1 represents a case in which, since data are correctly programmed to the memory cells in a second period, the programming verification flag signal PNVFLAG becomes a low level and a programming period is not progressed any more. The Case 2 represents a case in which, since data are not correctly programmed to the memory cells even after a fourth programming period is progressed, the programming verification flag signal PNVFLAG maintains continuously a high level and the fail signal FAIL is activated to a high level. That is to say, the Case 2 represents a case in which, even though the programming operation is progressed four times through the total four programming periods, data are not finally correctly programmed to the memory cells.

As is apparent from the above descriptions, in the semiconductor memory apparatus in accordance with an embodiment of the present invention, the number of periods during which a programming current pulse is supplied and a time for which the programming current pulse is supplied can be controlled by controlling the code values of the initial setting codes PNVINT<0:2> and the repetition times setting codes PNVVAL<0:2>. Also, a pattern in which the programming current pulse is supplied to a memory cell can be controlled. That is to say, by appropriately setting the code values of the initial setting codes PNVINT<0:2> and the repetition times setting codes PNVVAL<0:2>, it is possible to stably program a plurality of memory cells with different programming characteristics. For reference, the code values of the initial setting codes PNVINT<0:2> and the repetition times setting codes PNVVAL<0:2> may be set to values capable of stably and most quickly programming all the memory cells. Configuration may be made in such a manner that the plurality of memory cells are divided into groups and the initial setting codes PNVINT<0:2> and the repetition times setting codes PNVVAL<0:2> can be independently set for each group.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. In addition, the configuration of a logic gate may be changed as the occasion demands to realize the same function. That is to say, a NAND unit, a NOR unit, and so forth can be configured through various combinations of NAND gates, NOR gates and inverters. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a first write control code generation unit configured to generate first write control codes which are updated with different cycles in a plurality of respective periods, the first write control code generation unit determining the number of the plurality of periods depending upon a first code value and an update cycle of the first write control codes in an initial period among the plurality of periods; and
   a data write unit configured to output a first programming current pulse with a magnitude corresponding to a code combination of the first write control codes.

2. The semiconductor memory apparatus according to claim 1, further comprising:
   a second write control code generation unit configured to generate a second write control code which is activated for a predetermined time, in response to a programming enable signal,
   wherein the data write unit is configured to output the first programming current pulse with the magnitude corresponding to the code combination of the first write control codes which are updated or a second programming current pulse with a magnitude corresponding to the second write control code.

3. The semiconductor memory apparatus according to claim 1, wherein:
   the update cycle of the first write control codes is gradually lengthened for the plurality of periods as the respective periods are progressed;
   the first write control codes are updated with different cycles in response to a programming verification flag and a programming enable signal;
   the first code value is of repetition times setting codes;
   the update cycle is of the first write control codes; and
   the initial period depends upon a code value of initial setting codes.

4. The semiconductor memory apparatus according to claim 1, wherein the first write control code generation unit comprises:
   an input latch section configured to output a count enable signal and a clock enable signal in response to a period control signal which is activated after a preset time and a reset pulse signal;
   a clock generation control section configured to output cycle setting codes which are updated in a second code value thereof and a repetition end signal, in response to a programming verification flag signal and the reset pulse signal, the clock generation control section determining an initial code value of the cycle setting codes depending upon a code value of initial setting codes and the number of update times of the cycle setting codes depending upon the first code value of repetition times setting codes;
   a counting clock generation section configured to generate a counting clock signal in response to the clock enable signal and the repetition end signal, the counting clock generation section controlling a toggling cycle of the counting clock signal depending upon a code value of the cycle setting codes;
   a write control code counter section configured to generate counting codes which are counted under control of a programming enable signal, the count enable signal and the counting clock signal and output the first write control codes; and
   a reset pulse generation section configured to generate the reset pulse signal when the counting codes reach a predetermined value.

5. The semiconductor memory apparatus according to claim 4, wherein the clock generation control section activates the repetition end signal after the cycle setting codes are updated a number of times corresponding to the code value of the repetition times setting codes.

6. The semiconductor memory apparatus according to claim 4, wherein the second code value increases in each time the cycle setting codes are updated.

7. The semiconductor memory apparatus according to claim 4, wherein the update cycle of the first write control codes is controlled in correspondence to the toggling cycle of the counting clock signal.

8. The semiconductor memory apparatus according to claim 4, wherein the programming verification flag signal is a signal which indicates whether or not data are correctly programmed.

9. The semiconductor memory apparatus according to claim 4, wherein the clock generation control section comprises:
 a cycle setting code counter stage configured to receive the code value of the initial setting codes as an initial counting code value and perform a counting operation under control of the programming verification flag signal and the reset pulse signal;
 an addition stage configured to sum the code values of the repetition times setting codes and the initial setting codes and output summed codes;
 a comparison stage configured to compare the summed codes and counting codes outputted from the cycle setting code counter stage, and output a comparison result as the repetition end signal; and
 a fail signal output stage configured to output a fail signal which is selectively activated, in response to the programming verification flag signal and a programming verification signal.

10. The semiconductor memory apparatus according to claim 4, wherein the counting clock generation section comprises:
 a source clock generation stage configured to output a source clock signal which toggles with a predetermined cycle, in response to the clock enable signal;
 an internal counter stage configured to perform a counting operation under the control of the repetition end signal, the source clock signal and an internal reset signal and output internal counting codes; and
 an output clock generation stage configured to combine the internal counting codes and the cycle setting codes under the control of the source clock signal and output the counting clock signal and the internal reset signal.

11. The semiconductor memory apparatus according to claim 10, wherein the output clock generation stage comprises:
 a plurality of comparison parts configured to compare respective bit values of the internal counting codes and the cycle setting codes and output a plurality of comparison result signals;
 a signal combination part configured to combine the plurality of comparison result signals outputted from the plurality of comparison parts and output a combination signal; and
 a signal output part configured to output the counting clock signal and the internal reset signal under the control of the internal clock signal and the combination signal.

12. The semiconductor memory apparatus according to claim 10, wherein the output clock generation stage sums the cycle setting codes and a predetermined code value and then combines resultant codes with the internal counting codes.

13. A semiconductor memory apparatus comprising:

a period control signal generation unit configured to generate a period control signal which is activated after a first preset time;
 a first write control code generation unit configured to generate first write control codes which are updated with different cycles in a plurality of respective periods, the first write control code generation unit activating update of the first write control codes in response to the period control signal in each period, and determining the number of the plurality of periods depending upon a code value of repetition times setting codes and an update cycle of the first write control codes;
 a second write control code generation unit configured to generate a second write control code which is activated for a predetermined time; and
 a data write unit configured to output a first programming current pulse with a magnitude corresponding to a code combination of the first write control codes which are updated or a second programming current pulse with a magnitude corresponding to the second write control code.

14. The semiconductor memory apparatus according to claim 13, wherein the update cycle of the first write control codes is gradually lengthened for the plurality of periods as the respective periods are progressed wherein the first write control codes are updated in response to a programming verification flag signal and a programming enable signal; and
 wherein the update cycle of the first write control codes is done in an initial period among the plurality of periods depending upon a code value of initial setting codes.

15. The semiconductor memory apparatus according to claim 13, wherein the first preset time is controlled depending upon a code value of setting time control codes.

16. The semiconductor memory apparatus according to claim 13, wherein the first write control code generation unit comprises:
 an input latch section configured to output a count enable signal and a clock enable signal in response to the period control signal and a reset pulse signal where the period control signal is generated in response to a programming enable signal;
 a clock generation control section configured to output cycle setting codes which are updated in a code value thereof and a repetition end signal, in response to a programming verification flag signal and the reset pulse signal, the clock generation control section determining an initial code value of cycle setting codes depending upon a code value of initial setting codes and a number of update times of the cycle setting codes depending upon a code value of the repetition times setting codes;
 a counting clock generation section configured to generate a counting clock signal in response to the clock enable signal and the repetition end signal, the counting clock generation section controlling a toggling cycle of the counting clock signal depending upon a code value of the cycle setting codes;
 a write control code counter section configured to generate counting codes which are counted under the control of the programming enable signal, the count enable signal and the counting clock signal and output the first write control codes; and
 a reset pulse generation section configured to generate the reset pulse signal when the counting codes reach a predetermined value.

17. The semiconductor memory apparatus according to claim 16, wherein the clock generation control section activates the repetition end signal after the cycle setting codes are updated a number of times corresponding to the code value of the repetition times setting codes.

18. The semiconductor memory apparatus according to claim 16, wherein the code value of the cycle setting codes increases in each time the cycle setting codes are updated.

19. The semiconductor memory apparatus according to claim 16, wherein the update cycle of the first write control codes is controlled in correspondence to the toggling cycle of the counting clock signal.

20. The semiconductor memory apparatus according to claim 16, wherein the programming verification flag signal is a signal which indicates whether or not data are correctly programmed.

21. The semiconductor memory apparatus according to claim 16, wherein the clock generation control section comprises:
 a cycle setting code counter stage configured to receive the code value of the initial setting codes as an initial counting code value and perform a counting operation under the control of the programming verification flag signal and the reset pulse signal;
 an addition stage configured to sum code values of the repetition times setting codes and the initial setting codes and output summed codes;
 a comparison stage configured to compare the summed codes and counting codes outputted from the cycle setting code counter stage, and output a comparison result as the repetition end signal; and
 a fail signal output stage configured to output a fail signal which is selectively activated, in response to the programming verification flag signal and a programming verification signal.

22. The semiconductor memory apparatus according to claim 16, wherein the counting clock generation section comprises:
 a source clock generation stage configured to output a source clock signal which toggles with a predetermined cycle, in response to the clock enable signal;
 an internal counter stage configured to perform a counting operation under the control of the repetition end signal, the source clock signal and an internal reset signal and output internal counting codes; and
 an output clock generation stage configured to combine the internal counting codes and the cycle setting codes under the control of the source clock signal and output the counting clock signal and the internal reset signal.

23. The semiconductor memory apparatus according to claim 22, wherein the output clock generation stage comprises:
 a plurality of comparison parts configured to compare respective bit values of the internal counting codes and the cycle setting codes and output a plurality of comparison result signals;
 a signal combination part configured to combine the plurality of comparison result signals outputted from the plurality of comparison parts and output a combination signal; and
 a signal output part configured to output the counting clock signal and the internal reset signal under the control of the internal clock signal and the combination signal.

24. The semiconductor memory apparatus according to claim 22, wherein the output clock generation stage sums the cycle setting codes and a predetermined code value and then combines resultant codes with the internal counting codes.

25. A semiconductor memory apparatus comprising:
 a data write unit configured to output a programming current pulse with a magnitude corresponding to a code combination of write control codes which are updated wherein the programming current pulse stably programs a plurality of memory cells comprised of a phase change material.

26. The semiconductor memory apparatus of claim 25 further comprising:
 an input latch section configured to output a count enable signal and a clock enable signal in response to a period control signal which is activated after a preset time and a reset pulse signal;
 a clock generation control section configured to output cycle setting codes which are updated in a code value thereof and a repetition end signal, in response to a programming verification flag signal and the reset pulse signal, the clock generation control section determining an initial code value of the cycle setting codes depending upon a code value of initial setting codes and the number of update times of the cycle setting codes depending upon a code value of repetition times setting codes;
 a counting clock generation section configured to generate a counting clock signal in response to the clock enable signal and the repetition end signal, the counting clock generation section controlling a toggling cycle of the counting clock signal depending upon a code value of the cycle setting codes;
 a write control code counter section configured to generate counting codes which are counted under the control of a programming enable signal, the count enable signal and the counting clock signal and output write control codes; and
 a reset pulse generation section configured to generate the reset pulse signal when the counting codes reach a predetermined value.

27. The semiconductor memory apparatus according to claim 26, wherein the clock generation control section activates the repetition end signal after the cycle setting codes are updated the number of times corresponding to the code value of the repetition times setting codes.

28. The semiconductor memory apparatus according to claim 26, wherein the code value of the cycle setting codes increases in each time the cycle setting codes are updated.

29. The semiconductor memory apparatus according to claim 26, wherein the update cycle of the first write control codes is controlled in correspondence to the toggling cycle of the counting clock signal.

30. The semiconductor memory apparatus according to claim 26, wherein the programming verification flag signal is a signal which indicates whether or not data are correctly programmed.

31. The semiconductor memory apparatus according to claim 26, wherein the clock generation control section comprises:
 a cycle setting code counter stage configured to receive the code value of the initial setting codes as an initial counting code value and perform a counting operation under the control of the programming verification flag signal and the reset pulse signal;
 an addition stage configured to sum the code values of the repetition times setting codes and the initial setting codes and output summed codes;
 a comparison stage configured to compare the summed codes and counting codes outputted from the cycle setting code counter stage, and output a comparison result as the repetition end signal; and a fail signal output stage configured to output a fail signal which is selectively activated, in response to the programming verification flag signal and a programming verification signal.

32. The semiconductor memory apparatus according to claim 26, wherein the counting clock generation section comprises:
a source clock generation stage configured to output a source clock signal which toggles with a predetermined cycle, in response to the clock enable signal;
an internal counter stage configured to perform a counting operation under the control of the repetition end signal, the source clock signal and an internal reset signal and output internal counting codes; and
an output clock generation stage configured to combine the internal counting codes and the cycle setting codes under the control of the source clock signal and output the counting clock signal and the internal reset signal.

33. The semiconductor memory apparatus according to claim 32, wherein the output clock generation stage comprises:
a plurality of comparison parts configured to compare respective bit values of the internal counting codes and the cycle setting codes and output a plurality of comparison result signals;
a signal combination part configured to combine the plurality of comparison result signals outputted from the plurality of comparison parts and output a combination signal; and
a signal output part configured to output the counting clock signal and the internal reset signal under the control of the internal clock signal and the combination signal.

34. The semiconductor memory apparatus according to claim 32, wherein the output clock generation stage sums the cycle setting codes and a predetermined code value and then combines resultant codes with the internal counting codes.

* * * * *